(12) United States Patent
Wang et al.

(10) Patent No.: US 6,727,545 B2
(45) Date of Patent: Apr. 27, 2004

(54) SEMICONDUCTOR MEMORY ARRAY OF FLOATING GATE MEMORY CELLS WITH LOW RESISTANCE SOURCE REGIONS AND HIGH SOURCE COUPLING

(75) Inventors: Chih Hsin Wang, San Jose, CA (US); Amitay Levi, Cupertino, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 0 days.

(21) Appl. No.: 09/916,555

(22) Filed: Jul. 26, 2001

(65) Prior Publication Data

US 2002/0034849 A1 Mar. 21, 2002

Related U.S. Application Data

(60) Provisional application No. 60/234,314, filed on Sep. 20, 2000, provisional application No. 60/242,096, filed on Oct. 19, 2000, provisional application No. 60/260,167, filed on Jan. 5, 2001, provisional application No. 60/275,517, filed on Mar. 12, 2001, and provisional application No. 60/287,047, filed on Apr. 26, 2001.

(51) Int. Cl.$^7$ ............................................. H01L 29/788
(52) U.S. Cl. ............................................................ 257/321
(58) Field of Search ................................. 257/314–326

(56) References Cited

U.S. PATENT DOCUMENTS

| 4,757,360 A | 7/1988 | Faraone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |
| 5,429,965 A | 7/1995 | Shimoji |
| 5,544,103 A | 8/1996 | Lambertson |
| 5,572,054 A * | 11/1996 | Wang et al. ............... 257/322 |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 5,939,749 A * | 8/1999 | Taketa ....................... 257/316 |
| 6,091,104 A | 7/2000 | Chen |
| 6,103,573 A | 8/2000 | Harari et al. |
| 6,140,182 A | 10/2000 | Chen |
| 6,211,547 B1 * | 4/2001 | Kao .......................... 257/317 |
| 6,222,227 B1 | 4/2001 | Chen |
| 6,329,685 B1 * | 12/2001 | Lee ........................... 257/314 |

FOREIGN PATENT DOCUMENTS

EP    0 389 721 A2    10/1990

OTHER PUBLICATIONS

U.S. patent application Ser. No. 09/401,622, Johnson, filed Sep. 22, 1999.

* cited by examiner

Primary Examiner—Long Pham
Assistant Examiner—Marcos D. Pizarro-Crespo
(74) Attorney, Agent, or Firm—Gray Cary Ware & Freidenrich LLP

(57) ABSTRACT

A self aligned method of forming a semiconductor memory array of floating gate memory cells in a semiconductor substrate having a plurality of spaced apart isolation regions and active regions on the substrate substantially parallel to one another in the column direction, and an apparatus formed thereby. Floating gates are formed in each of the active regions. In the row direction, trenches are formed that include indentations or different widths. The trenches are filled with a conducting material to form blocks of the conducting material that constitute source regions with a first portion that is disposed adjacent to but insulated from the floating gate, and a second portion that this disposed over but insulated from the floating gate.

7 Claims, 19 Drawing Sheets

SEMICONDUCTOR MEMORY ARRAY OF FLOATING GATE MEMORY CELLS WITH LOW RESISTANCE SOURCE REGIONS AND HIGH SOURCE COUPLING

PRIORITY

This application claims the benefit of U.S. Provisional Application No. 60/234,314, filed Sep. 20, 2000, and entitled Super Self-Aligned Flash EEPROM Cell, and U.S. Provisional Application No. 60/242,096, filed Oct. 19, 2000, and entitled Ultra Self-Aligned Flash EEPROM Cell With SAC, U.S. Provisional Application No. 60/260,167, filed Jan. 5, 2001, and entitled A Super Self-Aligned Flash E2PROM Cell, U.S. Provisional Application No. 60/275,517, filed Mar. 12, 2001, and entitled Super Self-Aligned Flash E2PROM Cell, and U.S. Provisional Application No. 60/287,047, filed Apr. 26, 2001, and entitled An Ultra Self-Aligned Flash E2PROM Cell With Low Source Resistance and High Source Coupling.

TECHNICAL FIELD

The present invention relates to a self-aligned method of forming a semiconductor memory array of floating gate memory cells of the split gate type. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate, especially as the memory cells are scaled down in size. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

Two major issues are often implicated as memory cell dimensions are scaled down. First, the resistance in the source line increases with smaller memory cell dimensions, and a higher resistance suppresses the desirable cell current during a read event. Second, smaller memory cell dimensions result in a lower punch-through voltage $V_{PT}$ between the source and the bitline junction, which limits the achievable maximum floating-gate voltage $V_{fg}$ during a program event. Floating-gate voltage $V_{fg}$ is achieved through voltage coupling from the source region through the coupling oxide layer that is between the source and the floating gate. In a source-side injection mechanism, a higher $V_{fg}$ (and thus a higher punch-through voltage $V_{PT}$) is essential for a sufficient hot carrier injection efficiency.

SUMMARY OF THE INVENTION

The present invention solves the above mentioned problems by providing a (T-shaped) source region, where a wider conductive upper portion reduces source line resistance, while a narrower lower portion in the source line facilitates smaller memory cell geometries. The memory cell architecture also facilitates the coupling of source voltage to the floating gate through an oxide on the upper portion of the floating gate, in addition to coupling through the bottom coupling oxide, which enhances the coupling coefficient between the source electrode and the floating gate.

The present invention is a self-aligned method of forming a semiconductor memory array of floating gate memory cells in a semiconductor substrate, each memory cell having a floating gate, a first terminal, a second terminal with a channel region therebetween, and a control gate. The method comprises the steps of:

a) forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;

b) forming a plurality of spaced apart first trenches across the active regions and isolation regions which are substantially parallel to one another and extend in a second direction that is substantially perpendicular to the first direction, each of the first trenches having an upper portion and a lower portion wherein the upper portion has a greater width than that of the lower portion;

c) filling each of the first trenches with a conductive material to form first blocks of conductive material, wherein for each of the first blocks in each active region:

the first block includes a lower portion formed in the lower portion of the first trench that is disposed adjacent to and insulated from the first layer of conductive material, and the first block includes an upper portion formed in the upper portion of the first trench that is disposed over and insulated from the first layer of conductive material;

d) forming a plurality of first terminals in the substrate, wherein in each of the active regions each of the first terminals is adjacent to and electrically connected with one of the first blocks of conductive material; and e) forming a plurality of second terminals in the substrate, wherein in each of the active regions each of the second terminals is spaced apart from the first terminals.

In another aspect of the present invention, the method includes the steps of:

a) forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;

b) forming a plurality of spaced apart first trenches across the active regions and isolation regions which are substantially parallel to one another and extend in a second direction that is substantially perpendicular to the first direction, each of the first trenches having a side wall with an indentation formed therein;

c) filling each of the first trenches with a conductive material to form first blocks of conductive material, wherein for each of the first blocks in each active region:

the first block includes a lower portion formed below the indentation of the first trench sidewall that is disposed adjacent to and insulated from the first layer of conductive material, and the first block includes an upper portion formed above the indentation of the first trench sidewall that is disposed over and insulated from the first layer of conductive material;

d) forming a plurality of first terminals in the substrate, wherein in each of the active regions each of the first terminals is adjacent to and electrically connected with one of the first blocks of conductive material; and e) forming a plurality of second terminals in the substrate, wherein in each of the active regions each of the second terminals is spaced apart from the first terminals.

In yet another aspect of the present invention, an electrically programmable and erasable memory device includes a substrate of semiconductor material of a first conductivity type, first and second spaced-apart regions in the substrate of a second conductivity type with a channel region therebetween, a first insulation layer disposed over said substrate, an electrically conductive floating gate disposed over said first insulation layer and extending over a portion of the channel region and over a portion of the first region, and an electrically conductive source region disposed over and electrically connected to the first region in the substrate. The source region has a lower portion that is disposed adjacent to and insulated from the floating gate and an upper portion that is disposed over and insulated from the floating gate.

In yet one more aspect of the present invention, an array of electrically programmable and erasable memory devices includes: a substrate of semiconductor material of a first conductivity type, spaced apart isolation regions formed on the substrate which are substantially parallel to one another and extend in a first direction with an active region between each pair of adjacent isolation regions, and each of the active regions includes a column of pairs of memory cells extending in the first direction. Each of the memory cell pairs includes a first region and a pair of second regions spaced apart in the substrate having a second conductivity type with channel regions formed in the substrate between the first region and the second regions, a first insulation layer disposed over said substrate including over the channel regions, a pair of electrically conductive floating gates each disposed over the first insulation layer and extending over a portion of one of the channel regions and over a portion of the first region, and an electrically conductive source region disposed over and electrically connected to the first region in the substrate. The source region has a lower portion that is disposed adjacent to and insulated from the pair of floating gates and an upper portion that is disposed over and insulated from the pair of floating gates.

Other objects and features of the present invention will become apparent by a review of the specification, claims and appended figures.

DETAILED DESCRIPTION OF THE PREFERRED EMBODIMENTS

Figure 1A:
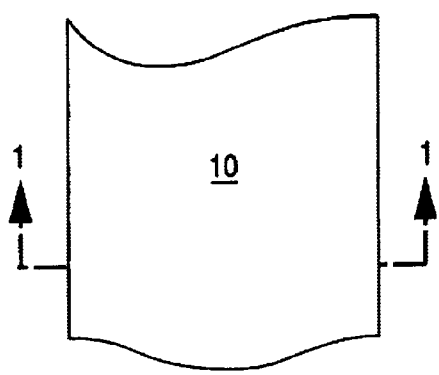
FIG. 1A is a top view of a semiconductor substrate used in the first step of the method of present invention to form isolation regions.
Figure 1B:
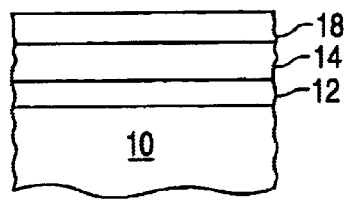
FIG. 1B is a cross sectional view taken along the line 1—1.

Referring to FIG. 1A there is shown a top plan view of a semiconductor substrate 10, which is preferably of P type and is well known in the art. A first layer of insulation material 12, such as silicon dioxide (oxide), is deposited thereon as shown in FIG. 1B. The first insulation layer 12 is formed on the substrate 10 by well known techniques such as oxidation or deposition (e.g. chemical vapor deposition or CVD), forming a layer of silicon dioxide (hereinafter "oxide"). A first layer of polysilicon 14 (FG poly) is deposited on top of the first layer of insulation material 12. The deposition and formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD. This nitride layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Figure 1C:
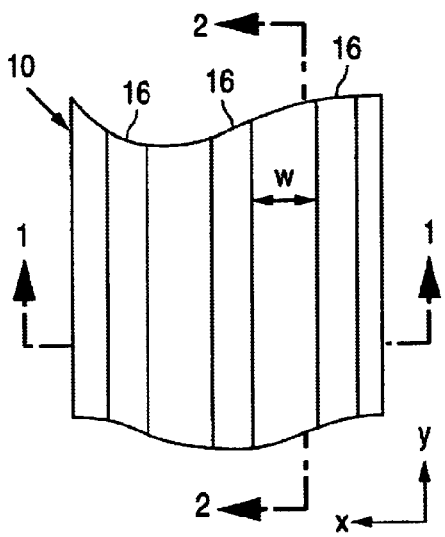
FIG. 1C is a top view of the next step in the processing of the structure of FIG. 1B, in which isolation regions are formed.
Figure 1D:
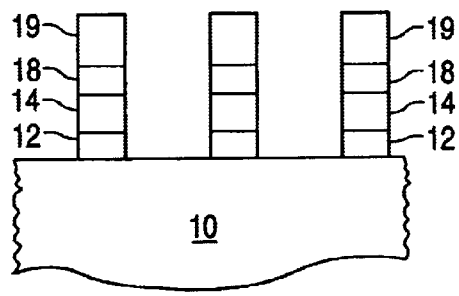
FIG. 1D is a cross sectional view of the structure in FIG. 1C taken along the line 1—1 showing the isolation stripes formed in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y direction or the column direction, as shown in FIG. 1C, using standard etching techniques (i.e. anisotropic etch process). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 1D. As will be described, there are two embodiments in the formation of the isolation regions: LOCOS and STI. In the STI embodiment, the etching continues into the substrate 10 to a predetermined depth.

The structure is further processed to remove the remaining photo resist 19. Then, an isolation material 20a or 20b, such as silicon dioxide, is formed in the regions or "grooves" 16. The nitride layer 18 is then selectively removed to form the structure shown in FIG. 1E. The isolation can be formed via the well known LOCOS process resulting in the local field oxide 20a (e.g. by oxidizing the exposed substrate), or it can be formed via a shallow trench process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 1E:
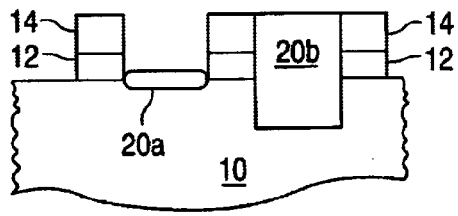
FIG. 1E is a cross sectional view of the structure in FIG. 1C taken along the line 1—1 showing the two types of isolation regions that can be formed in the semiconductor substrate: LOCOS or shallow trench.

The remaining first polysilicon layer 14 and the underlying first insulation material 12 form the active regions. Thus, at this point, the substrate 10 has alternating stripes of active regions and isolation regions with the isolation regions being formed of either LOCOS insulation material 20a or shallow trench insulation material 20b. Although FIG. 1E shows the formation of both a LOCOS region 20a and a shallow trench region 20b, only one of the LOCOS process (20a) or the shallow trench process (20b) will be used. In the preferred embodiment, the shallow trench 20b will be formed. Shallow trench 20b is preferable because it can be more precisely formed at smaller design rules.

The structure in FIG. 1E represents a self aligned structure, which is more compact than a structure formed by a non self-aligned method. A non self-aligned method of forming the structure shown in FIG. 1E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

Figure 2A:
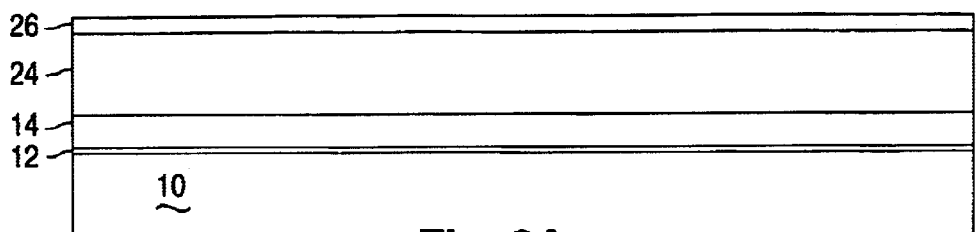
FIGS. 2A–2N are cross sectional views taken along the line 2—2 of FIG. 1C showing in sequence the next step(s) in the processing of the structure shown in FIG. 1C, in the formation of a non volatile memory array of floating memory cells of the split gate type.

With the structure shown in FIG. 1E made using either the self aligned method or the non self-aligned method, the structure is further processed as follows. Referring to FIG. 2A, which shows the structure from a view orthogonal to that of FIGS. 1B and 1E, the next steps in the process of the present invention are illustrated. A thick insulation layer 24, such as silicon nitride (hereinafter "nitride") is formed on the structure, followed by the formation of a thin protective layer 26 such as polysilicon (hereinafter "poly"). The resulting structure is illustrated in FIG. 2A.

Figure 2B:
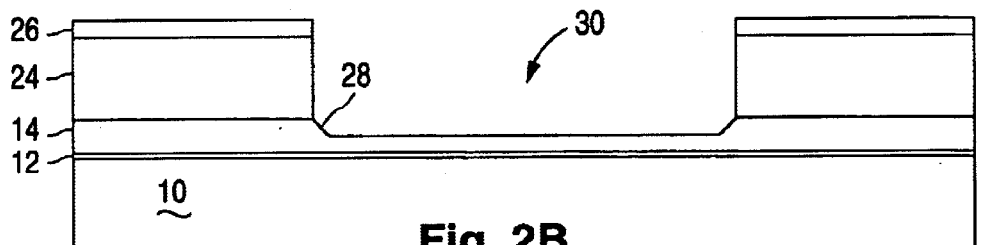
FIG. 2O is a top view showing the interconnection of row lines and bit lines to terminals in active regions in the formation of the non volatile memory array of floating memory cells of the split gate type.

A conventional photo-lithography masking operation is performed with photo-resist applied on top of the poly layer 26. A masking step is applied in which stripes (i.e. masking regions) are defined in the X or the row direction. The distance between adjacent stripes can be a size determined by the needs of the device to be fabricated. The photo resist is removed in defined masking regions, i.e. stripes in the row direction, after which poly layer 26 underlying the removed photo resist is etched away in the stripes using a conventional anisotropic poly etch process to expose portions of the underlying nitride layer 24. An anisotropic nitride etch process is then performed to remove the exposed portions of nitride layer 24 to expose portions of poly layer 14. An optional poly etch process can follow to remove just a top portion of the exposed poly layer 14, to slightly recess poly layer 14 relative to the remaining nitride layer 24, and to form sloped portions 28 of poly layer 14 where it meets nitride layer 24. For each such pair of mirror memory cells, these etch processes result in the formation of a single first trench 30 that extends down to (and preferably slightly into) polysilicon layer 14. The remaining photo-resist is then removed, resulting in the structure shown in FIG. 2B.

Figure 2C:
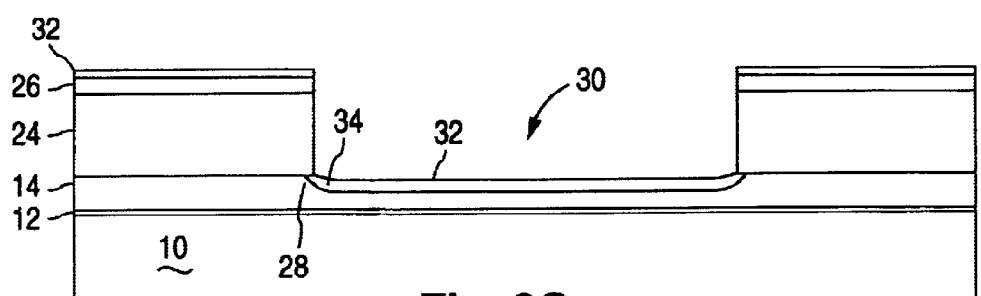

A layer 32 of insulation material, such as silicon dioxide (hereinafter "oxide") is then formed over the structure using, for example, a thermal oxidation process. The portions of oxide layer 32 formed on poly layer 14 in trenches 30 have raised portions 34 caused by sloped portions 28 of poly layer 14, giving oxide layer 32 inside trenches 30 a lens shape. The resulting structure is illustrated in FIG. 2C.

Figure 2D:
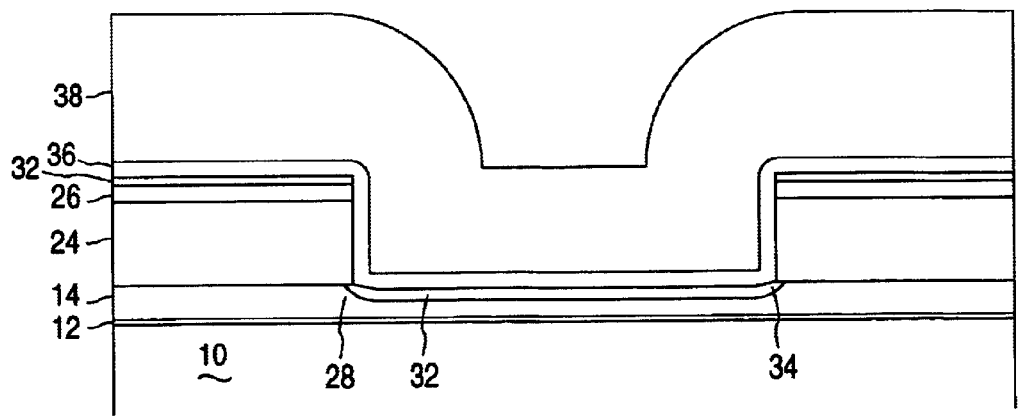
Figure 2E:
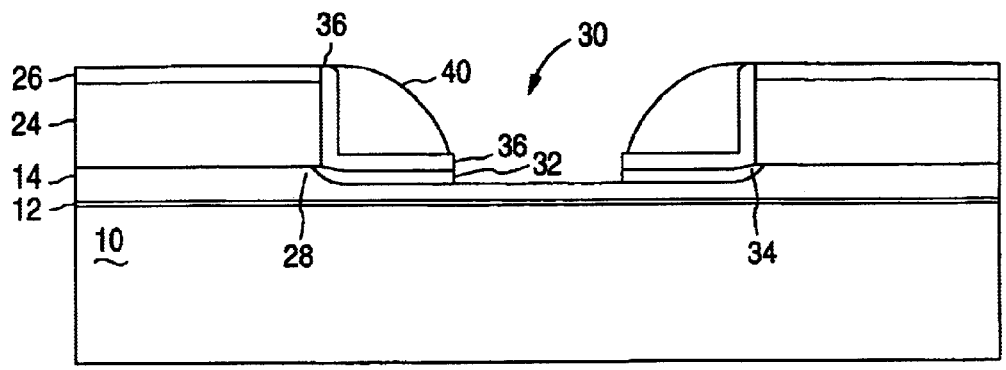

Insulation spacers 40 are then formed inside trenches 30 (FIG. 2E). Formation of spacers is well known in the art by depositing a material over the contour of a structure, followed by an anisotropic etch process (e.g. RIE), whereby the material is removed from horizontal surfaces of the structure, while the material remains largely intact on vertically oriented surfaces of the structure. Spacers 40 can be formed of any dielectric material. In the preferred embodiment, spacers 40 are formed of nitride in the following manner. A thin layer 36 of insulation material (i.e. oxide) is formed over the structure of FIG. 2C preferably using a conventional chemical vapor deposition (CVD) process. A thick layer 38 of insulation material (i.e. nitride) is then formed over the structure preferably by a conventional nitride deposition process, as shown in FIG. 2D. This is followed by a thick nitride etch process that uses oxide layer 36 as an etch stop. This etch process removes all of nitride layer 38, except for sidewall spacers 40 along the sidewalls of trenches 30. An anisotropic oxide etch process is then performed that uses poly layer 26 as an etch stop. This oxide etch removes exposed portions of oxide layers 36 and 32 that are over nitride layer 24. The oxide etch also removes portion of oxide layers 36 and 32 that are exposed in trenches 30 between spacers 40, to expose portions of poly layer 14 at the centers of the trenches 30. The resulting structure is shown in FIG. 2E.

Figure 2F:
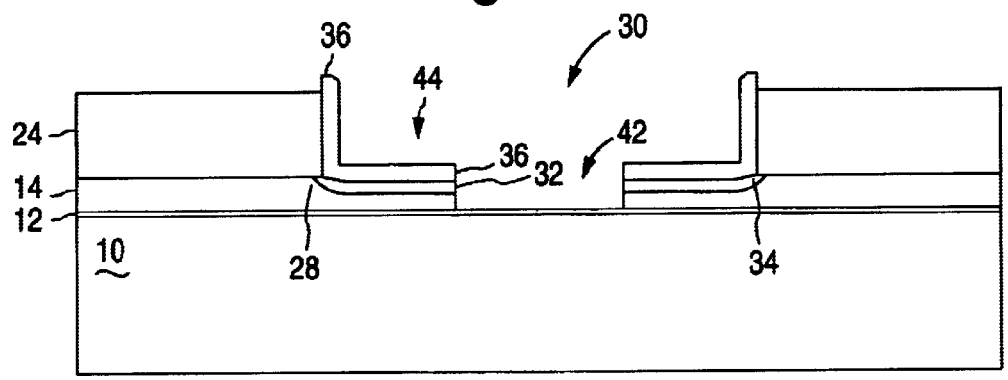

A thick nitride etch process is performed to remove spacers 40 from trenches 30. A poly etch process is then performed to remove poly layer 26 to expose nitride layer 24, and to remove the exposed portions of poly layer 14 at the bottom center of trenches 30 to expose oxide layer 12. As shown in FIG. 2F, trenches 30 each have a narrow lower portion 42 bounded by poly layer 14 and oxide layers 32 and 36, and an upper wider portion 44 bounded by oxide layer 36. It should be noted that the spacers 40 can be removed after the poly etch process that removes portions of poly layer 14.

Figure 2G:
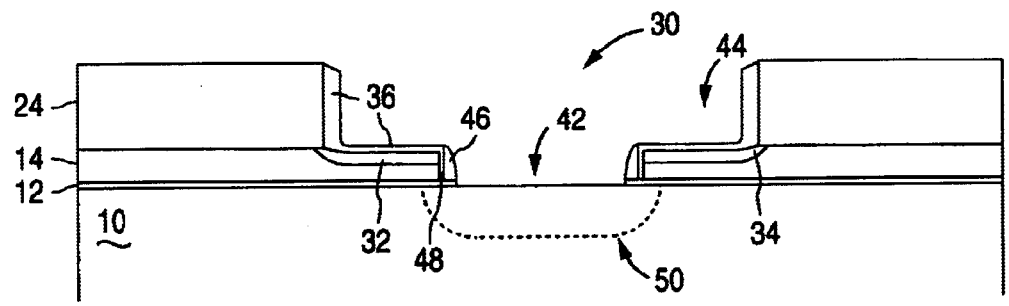

Suitable ion implantation is made across the entire surface of the structure. Where the ions have sufficient energy to penetrate the first silicon dioxide layer 12 in trench 30, they then form a first region (terminal) 50 in the substrate 10. In all other regions, the ions are absorbed by the existing structure, where they have no effect. Insulation spacers 46 (e.g. oxide) are formed on sidewalls of the lower portions 42 of trenches 30. Preferably, oxide spacer 46 formation is preceded by first forming an insulation sidewall layer 48 (oxide) on the sides of polysilicon layer 14 that are exposed inside trenches 30 (i.e. by oxidizing the structure or by CVD). Then, oxide is formed over the structure (i.e. CVD process), followed by an oxide anisotropic etch, which removes the oxide formed over the structure, except for oxide spacers 46 formed on the sidewalls of lower trench portion 42. This oxide formation and etch process also adds to the thickness of the vertical portion of oxide layer 36 in upper trench portion 44. The anisotropic etch also removes a top portion of oxide layer 36, thins down the portion of oxide layer 36 over oxide layer 32, as well as removes the portion of oxide layer 12 at the bottom of trenches 30 in between spacers 46 to expose the substrate 10. The resulting structure is shown in FIG. 2G.

Figure 2H:
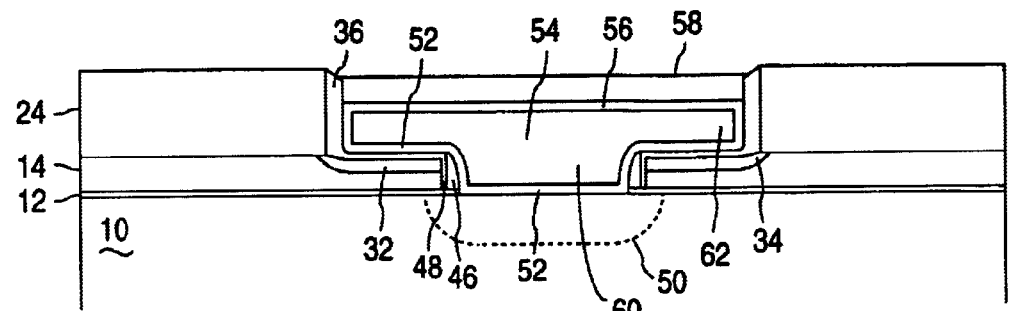

A conductive layer 52, such as titanium nitride which adheres well to the exposed substrate 10, is formed over the entire structure, which lines the sidewalls of trenches 30 and exposed substrate 10 therein. This is followed by the formation of conductive blocks 54 inside trenches 30, which are formed by depositing a conductive material such as tungsten over the structure, followed by a tungsten planarization process (preferably CMP), to fill trenches 30 with conductive blocks 54. A tungsten etch-back step follows to remove any tungsten outside of trenches 30, and to preferably define the top surfaces of conductive blocks 54 below the tops of oxide layers 36. A conductive layer 56 (titanium nitride) is then formed over conductive blocks 54, preferably by depositing titanium nitride over the structure, followed by a planarizing (CMP) process that removes the deposited titanium nitride except for the conductive layer 56 over conductive blocks 54 in trenches 30. A titanium nitride etch is then performed so that conductive layer 56 is recessed below the top of oxide layer 36. A layer 58 of insulation material (oxide) is then formed over the structure, followed by a planarization process (CMP) and oxide etch process to remove the deposited oxide except for that portion over conductive layer 56. The resulting structure is shown in FIG. 2H, where the narrow/wide trench portions 42/44 result in substantially T-shaped tungsten conductive blocks 54 with narrow lower block portions 60 and wider upper block portions 62, which are surrounded by titanium nitride layers 52/56.

Figure 2I:
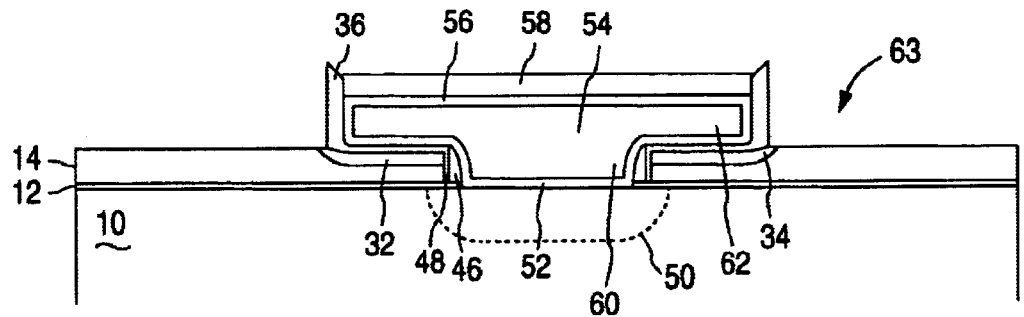

Second trenches 63 are formed between pair sets of memory cells and adjacent to first trenches 30 in the following manner. Nitride layer 24 is removed, preferably using an isotropic etch process, to expose portions of poly layer 14 and oxide layer 32 as shown in FIG. 2I. A poly etch process follows (i.e. a dry etch) to remove exposed portions of poly layer 14 and to expose oxide layer 12. The exposed portions of oxide layer 12 are then removed via a controlled oxide etch, exposing substrate 10. An insulation layer 64, preferably oxide, is then formed over the entire structure, resulting in the structure shown in FIG. 2J. The raised portions 34 of oxide layer 32 result in the formation of upwardly extending sharp edges 66 of poly layer 14 where layer 14 meets oxide layer 64.

Figure 2J:
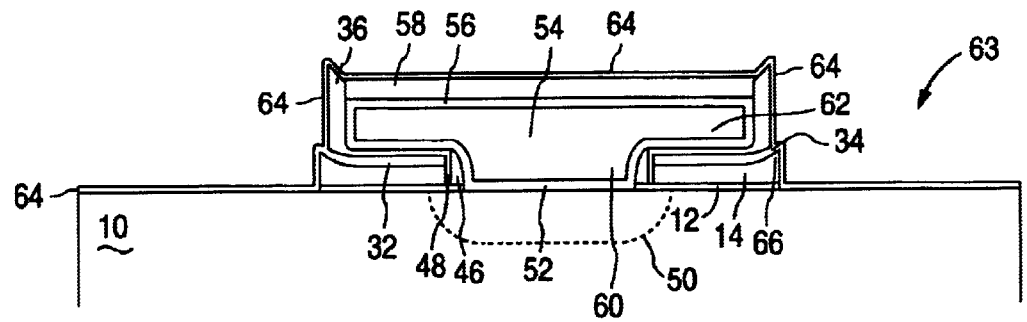
Figure 2K:
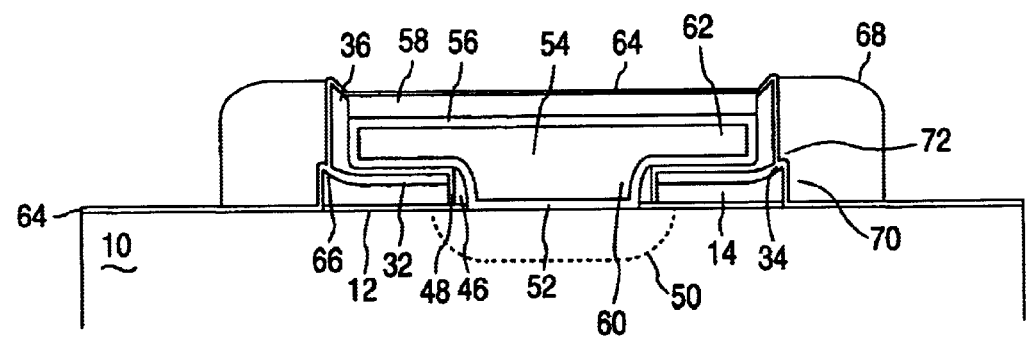

Control gate poly blocks are formed in second trenches 63 in the following manner. A thick layer of polysilicon is deposited over the structure, followed by an anisotropic poly etch process, which removes all the deposited polysilicon except for poly spacers (blocks) 68 formed against vertically oriented portions of oxide layer 64. Poly blocks 68 have lower portions 70 disposed immediately adjacent to poly layer 14, and upper portions 72 that extend over a portion of the poly layer 14 including sharp edge 66. Poly blocks 68 are insulated from poly layer 14 by oxide layers 64 and 32. The resulting structure is illustrated in FIG. 2K.

Figure 2L:
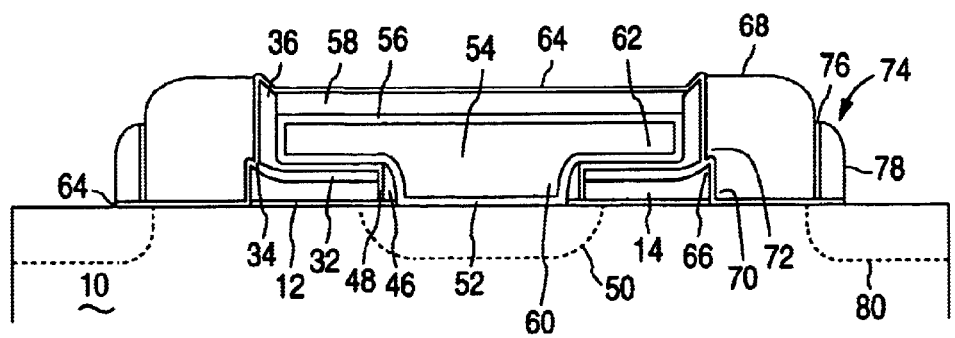

Insulation spacers 74 are then formed adjacent to poly blocks 68, and are made of one or more layers of material. In the preferred embodiment, insulation spacers 74 are made of two layers of material by first depositing a thin layer 76 of oxide, followed by the deposition of nitride over the structure. An anisotropic nitride etch is performed to remove the deposited nitride, leaving nitride spacers 78. Ion implantation (e.g. N+) is then used to form second regions (terminals) 80 in the substrate in the same manner as the first regions 50 were formed. A controlled oxide etch follows, which removes the exposed portions of oxide layer 76, as well as the exposed portions of oxide layer 64 to expose substrate 10 and the second regions 80. The resulting structure is shown in FIG. 2L.

Figure 2M:
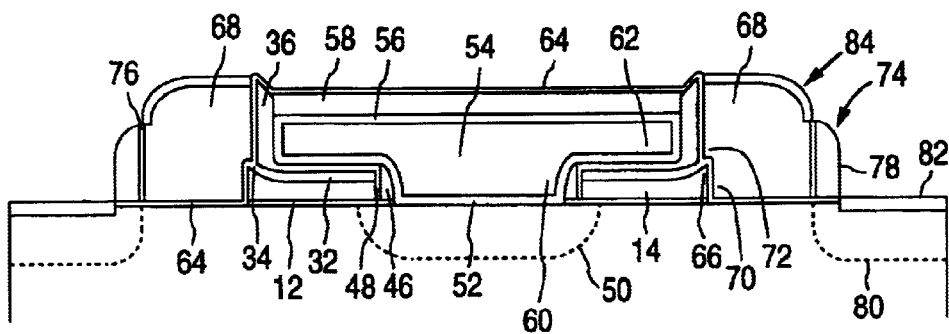

A layer of metalized silicon (silicide) 82 is formed in the top of the substrate 10 next to side wall spacers 74, along with a layer of metalized silicon 84 over poly blocks 68, by depositing a metal such as tungsten, cobalt, titanium, nickel, platinum, or molybdenum over the structure. The structure is then annealed, permitting the hot metal to flow and to seep into the exposed top portions of the substrate to form silicide 82, and into the exposed top portions of poly blocks 68 to form metalized silicon 84. The metal deposited on the remaining structure is removed by a metal etch process. Metalized silicon region 82 on substrate 10 can be called self aligned silicide (i.e. salicide), because it is self aligned to the second regions 80 by spacers 78. The resulting structure is shown in FIG. 2M.

Passivation, such as BPSG 86, is used to cover the entire structure. A masking step is performed to define etching areas over the silicide regions 82. The BPSG 86 is selectively etched in the masked regions to create contact openings that are ideally centered over and extend down to silicide regions 82 formed between adjacent sets of paired memory cells. The contact openings are then filled with a conductor metal by metal deposition and planarization etch-back to form contact conductors 88. The silicide layers 82 facilitate conduction between the conductors 88 and second regions 80. A bit line 90 is added by metal masking over the BPSG 86, to connect together all the conductors 88 in the column of memory cells. The final memory cell structure is illustrated in FIG. 2N.

Figure 2O:
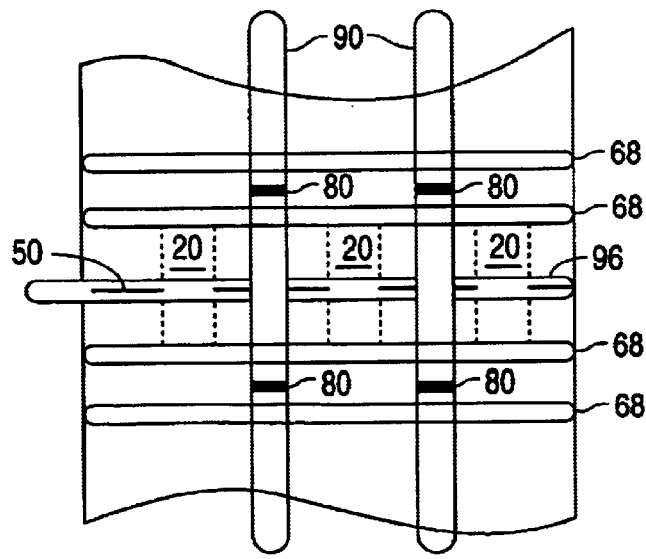
Figure 2N:
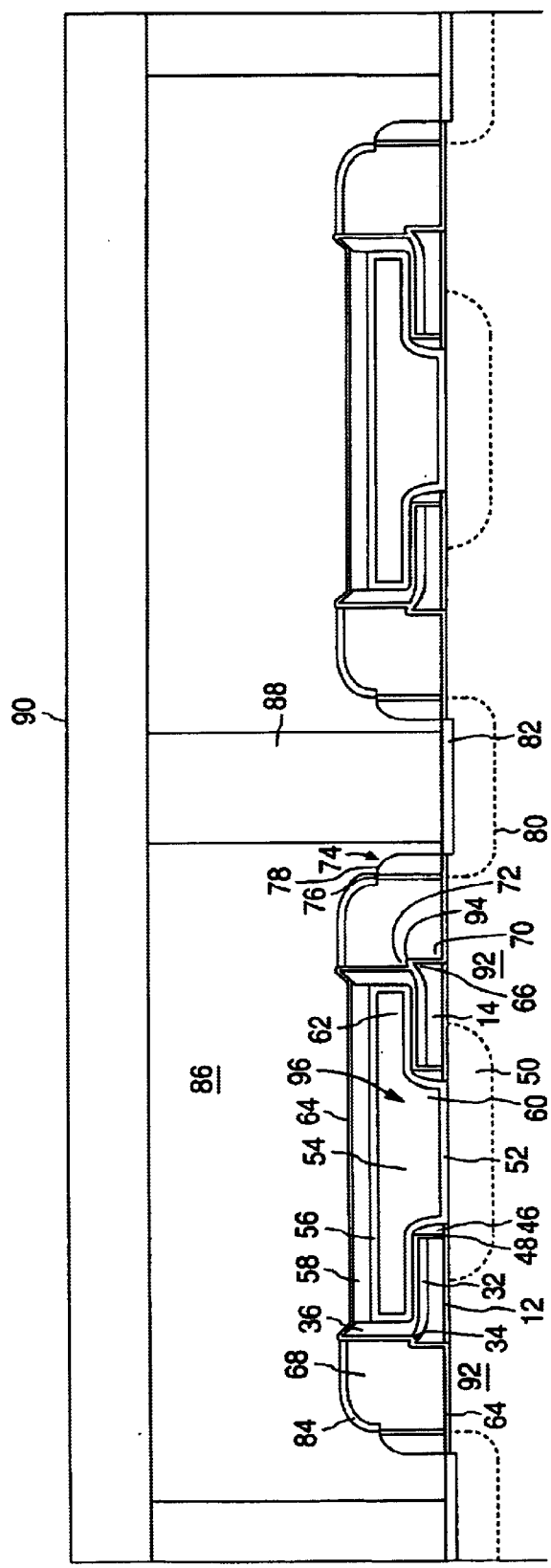

As shown in FIG. 2N, first and second regions 50/80 form the source and drain for each cell (those skilled in the art know that source and drain can be switched during operation). The channel region 92 for each cell is the portion of the substrate that is in-between the source and drain 50/80. Poly blocks 68 constitute the control gate, and poly layer 14 constitutes the floating gate. Oxide layers 32, 36, 46 and 48 together form an insulation layer that is disposed adjacent to and over floating gate 14, to isolate it from conductive block 54 and conductive layer 52. Oxide layers 36 and 64 together form an insulation layer that isolates the conductive block 54 and conductive layer 52 from the control gates 68. The control gates 68 have one side aligned to the edge of the second region 80, and are disposed over part of the channel regions 92. Control gates 68 have lower portions 70 that are disposed adjacent to the floating gates 14 (insulated therefrom by oxide layer 64), and upper protruding portions 72 that are disposed (extend) over a portion of adjacent poly layers 14 (insulated therefrom by oxide layers 64). A notch 94 is formed by the protruding portion 72, where the sharp edge 66 of floating gate 14 extends into the notch 94. Each floating gate 14 is disposed over part of the channel region 92, is partially overlapped at one end by the control gate 68, and partially overlaps the first region 50 with its other end. Conductive blocks 54 and the conductive layers 52/56 together form source lines 96 that extend across the columns of memory cells. Upper portions 62 of source lines 96 extend over but are insulated from the floating gates 14, while lower portions 60 of source lines 96 are adjacent to but insulated from floating gates 14. As illustrated in the FIG. 2N, the process of the present invention forms pairs of memory cells that mirror each other. The pairs of mirrored memory cells are insulated from other cell pairs by oxide layer 76, nitride spacers 78 and BPSG 86.

Referring to FIG. 2O, there is shown a top plan view of the resulting structure and the interconnection of the bit lines 90 to the second regions 80, of the control lines 68 which run in the X or the row direction, and of the source lines 96 which connect to the first regions 50 within the substrate 10. Although the source lines 96 (as should be understood by those skilled in the art, the word "source" is interchangeable with the word "drain") make contact with the substrate 10 in the entire row direction, i.e. contact with the active regions as well as the isolation regions, the source lines 96 electrically connect only to the first regions 50 in the substrate 10. In addition, each first region 50 to which the "source" line 96 is connected is shared between two adjacent memory cells. Similarly, each second region 80 to which the bit line 90 is connected is shared between adjacent memory cells from different mirror sets of memory cells.

The result is a plurality of non volatile memory cells of the split gate type having a floating gate 14, a control gate 68 which is immediately adjacent to but separated from the floating gate 14 and runs along the length of the row direction connecting to the control gates of other memory cells in the same row, a source line 96 which also runs along the row direction, connecting pairs of the first regions 50 of the memory cells in the same row direction, and a bit line 90 which runs along the column or Y direction and connects pairs of the second regions 80 of the memory cells in the same column direction. The formation of the control gate, the floating gate, the source line, and the bit line, are all self-aligned. The non-volatile memory cell is of the split gate type having floating gate to control gate tunneling all as described in U.S. Pat. No. 5,572,054, whose disclosure is incorporated herein by reference with regard to the operation of such a non-volatile memory cell and an array formed thereby.

The present invention exhibits reduced source line resistance because of the wider upper portion 62 of T-shaped conductive block 52, while still providing for smaller scaling of memory cell dimensions due to the narrower lower portions 60 of T-shaped conductive blocks 52 (i.e. the indentation of the sidewalls of the first trenches 30 between upper and lower portions 62/60 that forms the T-shape of the source line). The upper portions 62 also extend over but are insulated from the floating gates 14 which allows coupling of source voltage from the source line 96 to the floating gates 14 through the oxide layers 32/36 (which is in addition to the coupling via the lower portions 60 through oxide layers 46/48, and via first region 50 through oxide layer 12). Thus, the coupling coefficient between the source electrode and the floating gate is enhanced.

First Alternate Embodiment

FIGS. 3A–3I illustrate a first alternate process for forming a memory cell array similar to that illustrated in FIG. 2N, but with a polysilicon source line. This first alternate process begins with the same structure as shown in FIG. 2G, but continues as follows.

Figure 3A:
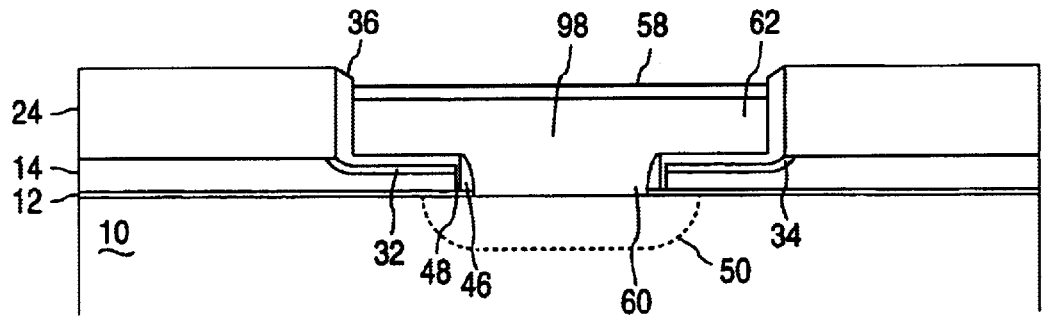
FIGS. 3A–3I are cross sectional views taken along the line 2—2 of FIG. 1C showing in sequence the steps in a first alternate processing of the structure shown in FIG. 1C, in the formation of a non volatile memory array of floating memory cells of the split gate type.

Conductive blocks 98 are formed inside trenches 30, preferably by depositing a conductive material such as polysilicon over the structure, followed by a poly planarization process (preferably CMP) to remove polysilicon above trenches 30. A poly etch-back step follows to remove any polysilicon outside of trenches 30, and to recess the top surfaces of conductive blocks 98 below the tops of oxide layers 36. The poly blocks 98 can be in-Situ doped or doped using implantation. A layer 58 of insulation material (oxide) is then formed over poly blocks 98, for example by thermal oxidation, or by oxide deposition followed by a CMP planarization process and an oxide etch process so that oxide layer 58 is recessed below the top of oxide layer 36. The resulting structure is shown in FIG. 3A, where the narrow/wide trench portions 42/44 result in substantially T-shaped conductive poly blocks 98 with narrow lower block portions 60 and wider upper block portions 62.

Figure 3B:
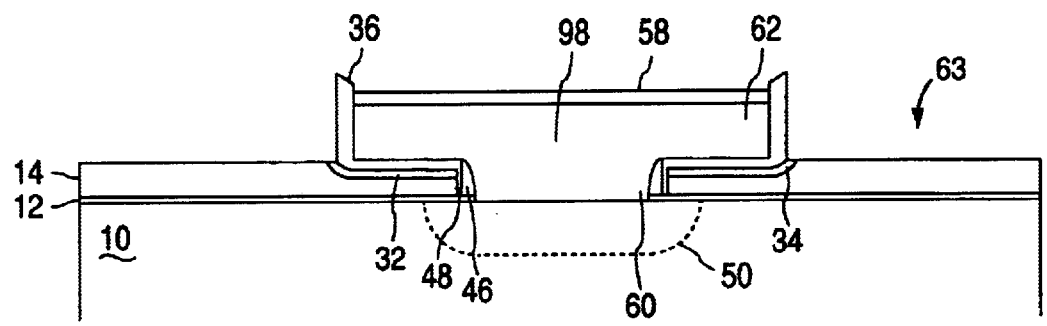

Second trenches 63 are formed between pair sets of memory cells and adjacent to first trenches 30 in the following manner. Nitride layer 24 is removed, preferably using an isotropic etch process, to expose portions of poly layer 14 and oxide layer 32 as shown in FIG. 3B. A poly etch process follows (i.e. a dry etch) to remove exposed portions of poly layer 14 and to expose portions of oxide layer 12. The exposed portions of oxide layer 12 are then removed via a controlled oxide etch, exposing substrate 10. An insulation layer 64, preferably oxide, is then formed over the entire structure, resulting in the structure shown in FIG. 3C. The raised portions 34 of oxide layer 32 result in the formation of upwardly extending sharp edges 66 of poly layer 14 where layer 14 meets oxide layer 64.

Figure 3C:
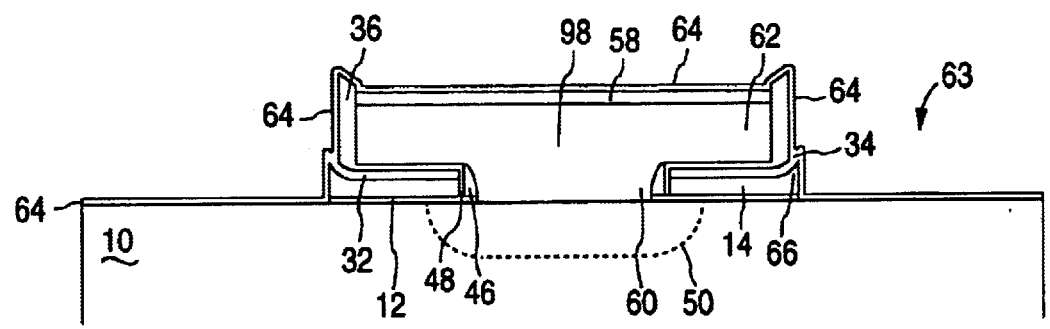
Figure 3D:
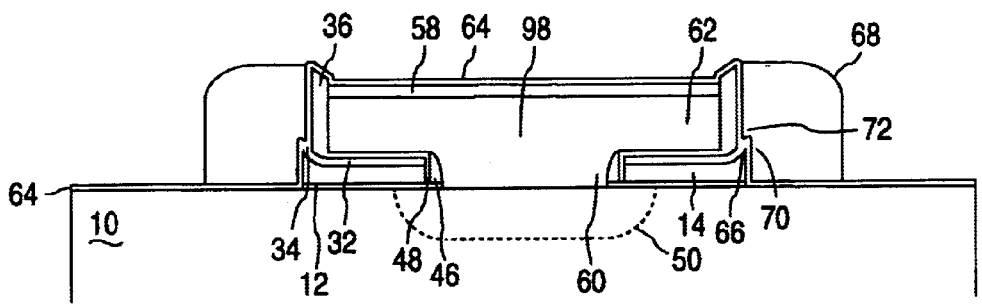

Control gate poly blocks are formed in second trenches 63 in the following manner. A thick layer of polysilicon is deposited over the structure, followed by an anisotropic poly etch process, which removes all the deposited polysilicon except for poly spacers (blocks) 68 formed against vertically oriented portions of oxide layer 64. Poly blocks 68 have lower portions 70 disposed immediately adjacent to poly layer 14, and upper portions 72 that extend over a portion of the poly layers 14 including sharp edges 66. Poly blocks 68 are insulated from poly layer 14 by oxide layers 64 and 32. The resulting structure is illustrated in FIG. 3D.

Figure 3E:
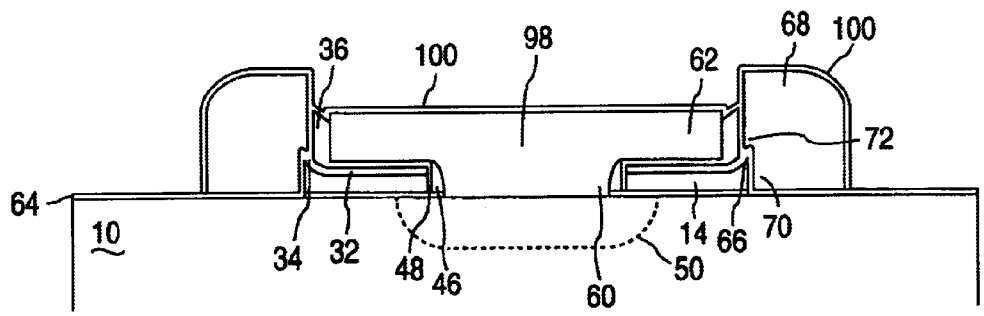

An oxide etch is performed to remove exposed portions of oxide layer 64, and the underlying oxide layer 58, to expose poly blocks 98 and substrate 10. Preferably, a dry-etch process with end-point detection is used, which also removes the upper portions of oxide layer 36, so that it is substantially even with the top surface of poly blocks 98. An oxide deposition process follows to form an oxide layer 100 over the structure, and to replace oxide layer 64 over the substrate 10. The resulting structure is illustrated in FIG. 3E.

Figure 3F:
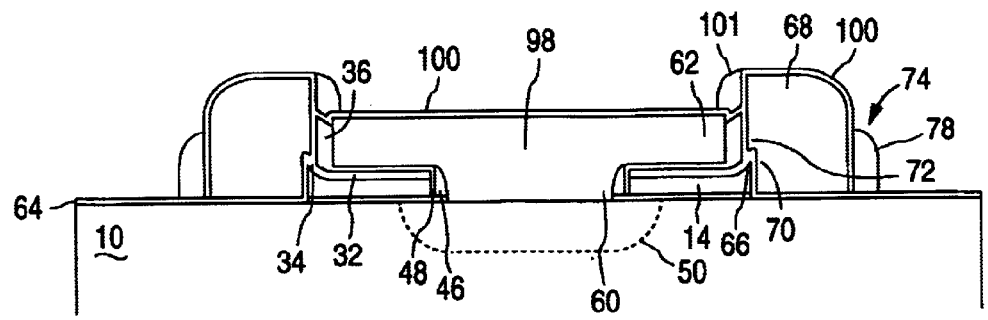

Insulation spacers 74 are then formed adjacent to poly blocks 68, and are made of one or more layers of material. In the preferred embodiment, insulation spacers 74 are composite spacers that include lower portions of oxide layer 100 and nitride spacers 78 formed by the deposition of nitride over the structure followed by an anisotropic nitride etch to remove the deposited nitride (using the oxide layer 100 as an etch stop), leaving nitride spacers 78 over oxide layer 64 and adjacent to poly spacers 68. Nitride spacers 101 are also formed over the ends of conductive blocks 98, as shown in FIG. 3F.

Figure 3G:
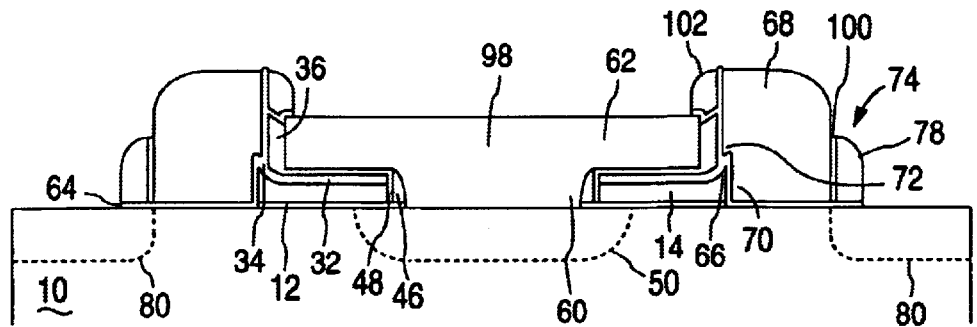

Ion implantation (e.g. N+) is then used to form second regions (terminals) 80 in the substrate in the same manner as the first regions 50 were formed. A controlled oxide etch follows to remove the exposed portions of oxide layer 100 to expose poly blocks 98, and to remove exposed portions of oxide layer 64 to expose the substrate 10. The resulting structure is shown in FIG. 3G.

Figure 3H:
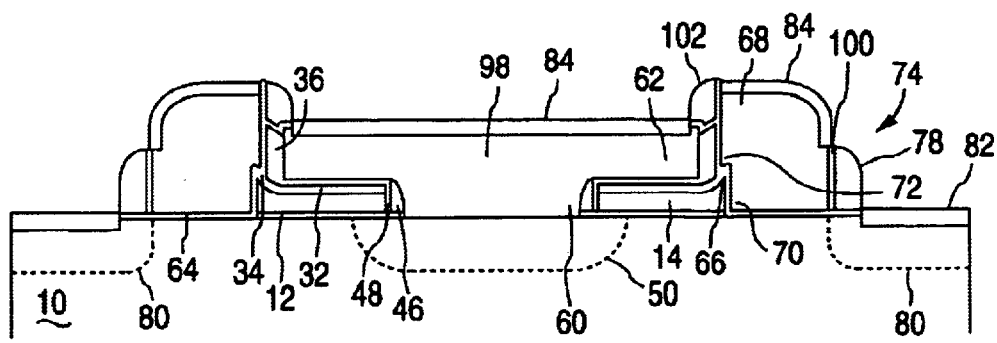

A layer of metalized silicon (silicide) 82 is formed in the top of the substrate 10 next to side wall spacers 74, along with a layer of metalized silicon 84 over poly blocks 68 and poly block 98, by depositing a metal such as tungsten, cobalt, titanium, nickel, platinum, or molybdenum over the structure. The structure is then annealed, permitting the hot metal to flow and to seep into the exposed top portions of the substrate to form silicide 82, and into the exposed top portions of poly blocks 68 and 98 to form metalized silicon 84. The metal deposited on the remaining structure is removed by a metal etch process. Metalized silicon region 82 on substrate 10 can be called self aligned silicide (i.e. salicide), because it is self aligned to the second regions 80 by spacers 78. The resulting structure is shown in FIG. 3H.

Figure 3I:
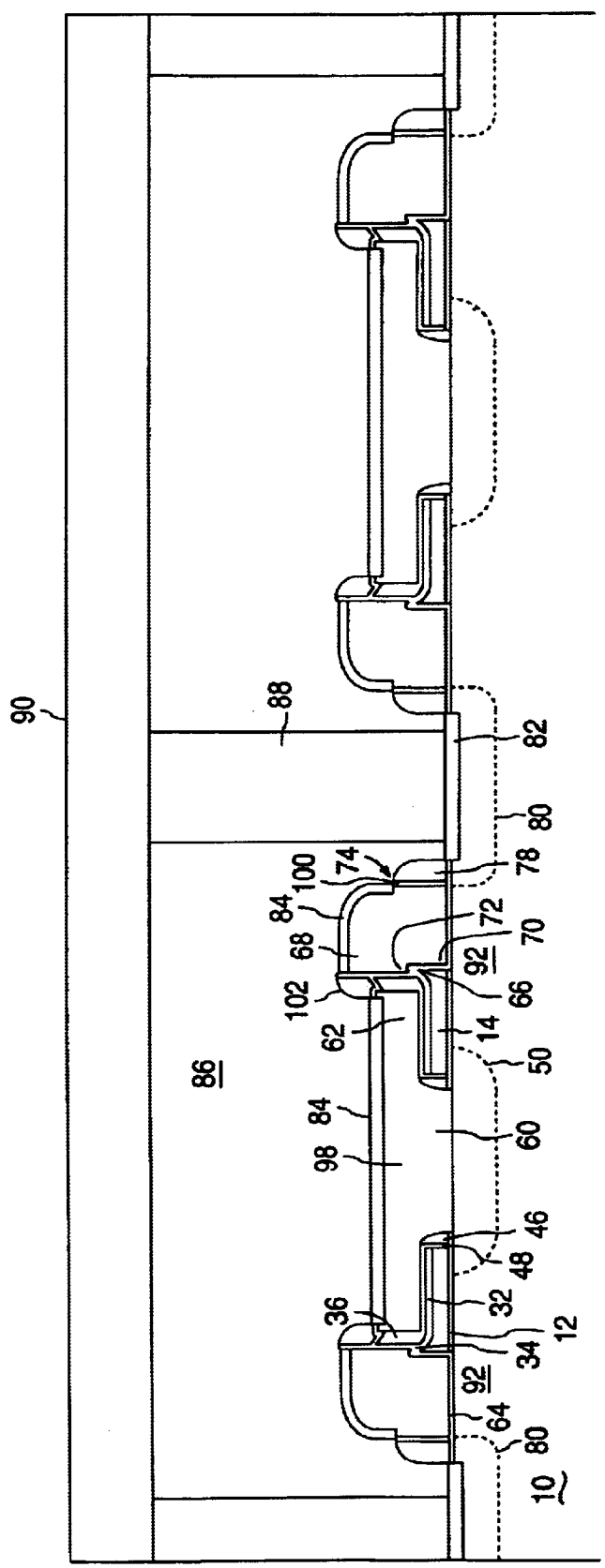

Passivation, such as BPSG 86, is used to cover the entire structure. A masking step is performed to define etching areas over the silicide regions 82. The BPSG 86 is selectively etched in the masked regions to create contact openings that are ideally centered over and extend down to silicide regions 82 formed between adjacent sets of paired memory cells. The contact openings are then filled with a conductor metal by metal deposition and planarization etch-back to form contact conductors 88. The silicide layers 82 facilitate conduction between the conductors 88 and second regions 80. A bit line 90 is added by metal masking over the BPSG 86, to connect together all the conductors 88 in the column of memory cells. The final memory cell structure is illustrated in FIG. 3I.

The first alternate embodiment exhibits reduced source line resistance because of the wider upper portion 62 of T-shaped poly block 98 and the highly conductive metalized silicon layer 84 formed thereon, while still providing for smaller scaling of memory cell dimensions due to the narrower lower portion 60 of T-shaped conductive block 98. The upper portions 62 also extend over the floating gate 14 which allows coupling of source voltage from the poly block 98 to the floating gate 14 through the oxide layers 32/36 (in addition to the coupling through the oxide layers 46/48 via lower portions 60, and through the oxide layer 12 via first region 50). Thus, the coupling coefficient between the source electrode and the floating gate is enhanced.

Second Alternate Embodiment

FIGS. 4A–4I illustrate a second alternate process for forming a memory cell array similar to that illustrated in FIG. 2N, but utilizing a self aligned contact scheme. This second alternate process begins with the same structure as shown in FIG. 2J, but continues as follows.

Figure 4A:
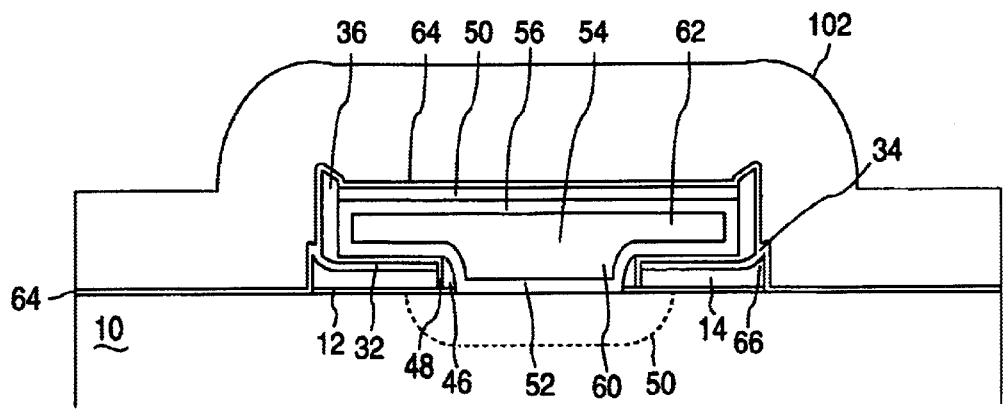
FIGS. 4A–4J are cross sectional views taken along the line 2—2 of FIG. 1C showing in sequence the steps in a second alternate processing of the structure shown in FIG. 1C, in the formation of a non volatile memory array of floating memory cells of the split gate type.
Figure 4B:
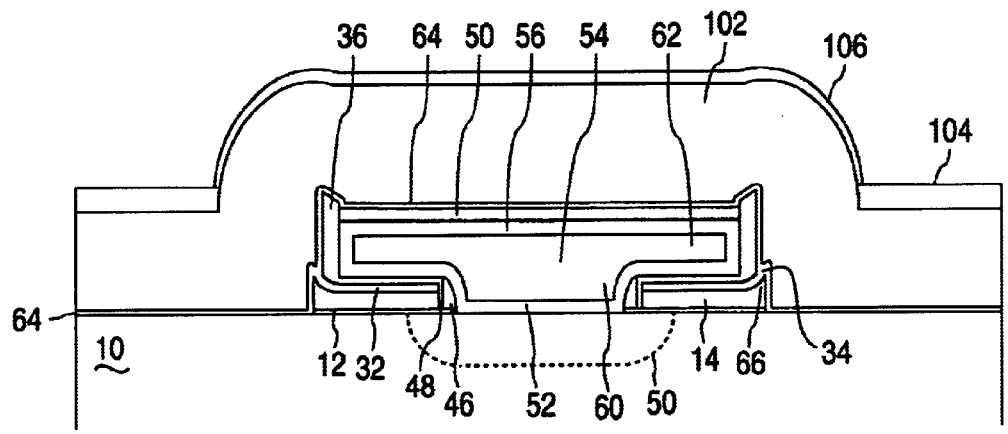

A thick layer 102 of conductive material, such as polysilicon, is deposited over the structure, as shown in FIG. 4A. A layer of nitride 104 is then deposited over the structure, followed by a nitride planarization process (e.g. CMP). A nitride etch-back step follows to remove the portions of nitride layer 104 over the raised portions of poly layer 102, while leaving portions of nitride layer 104 over the flat side portions of poly layer 102. An oxidation step follows, which oxidizes the exposed center portions of poly layer 102 to form a layer of oxide 106 thereover. The resulting structure is shown in FIG. 4B.

Figure 4C:
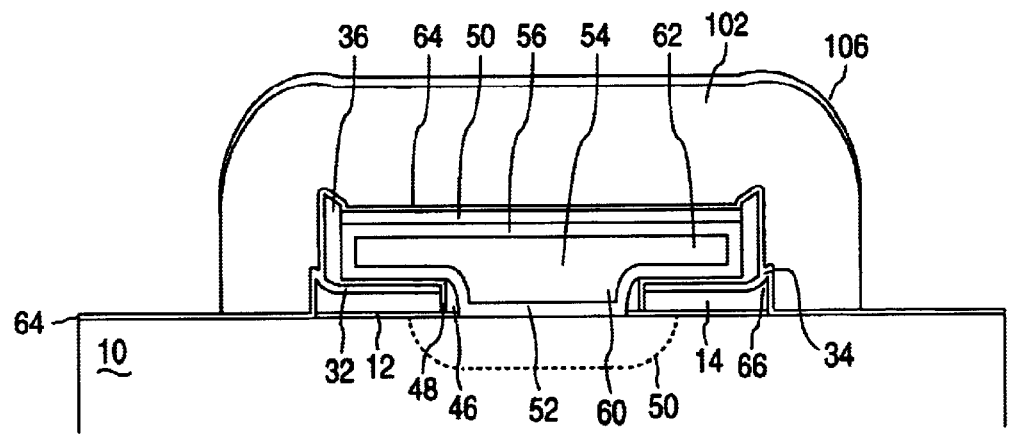
Figure 4D:
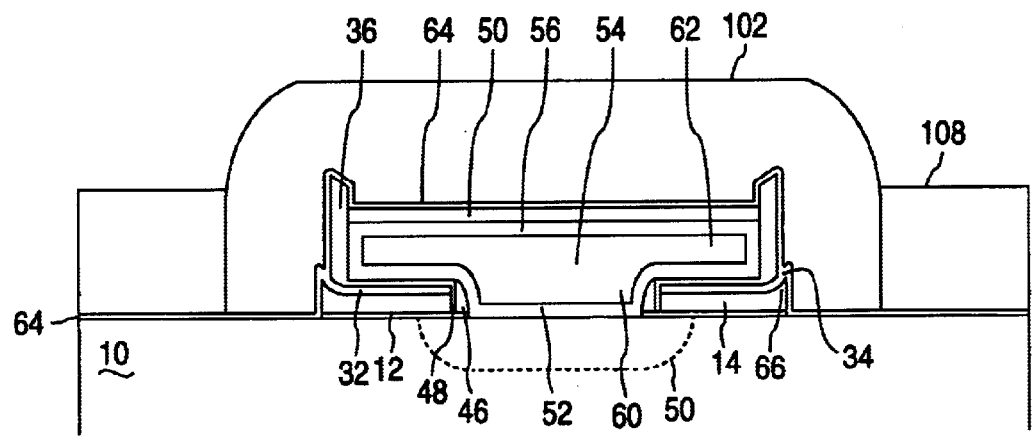

Nitride layer 104 is removed by a nitride etch process, which is followed by an anisotropic poly etch step to remove those portions of poly layer 102 not directly under oxide layer 106, as illustrated in FIG. 4C.

Figure 4E:
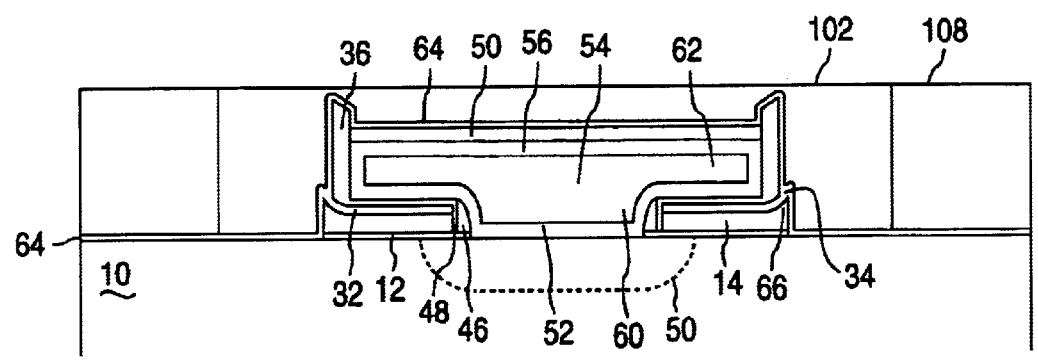
Figure 4F:
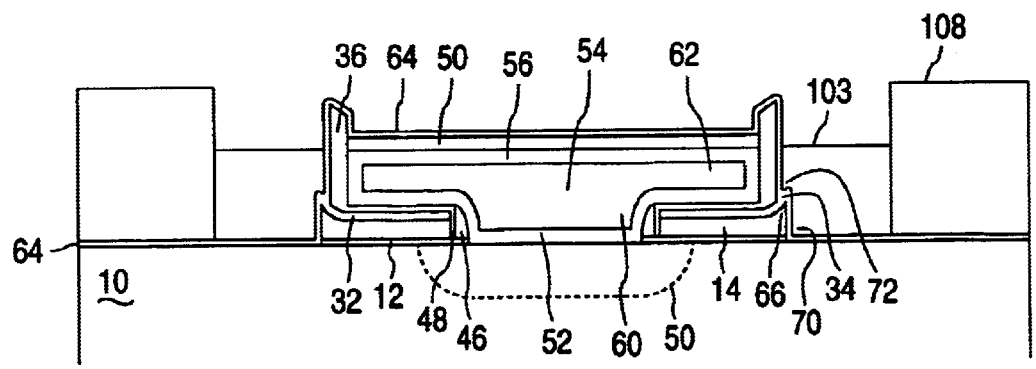

An oxide deposition step is then performed to apply a thick oxide layer over the structure. This is followed by a planarizing oxide etch, such as CMP, to planarize the structure using poly layer 102 as an etch stop. An oxide etch-back step is then performed, leaving blocks 108 of oxide on either side of the poly layer 102. Oxide layer 106 is also removed by the oxide planarizing and etch-back steps, resulting in the structure shown in FIG. 4D. A planarizing poly etch, such as CMP, is then performed using the oxide blocks 108 as an etch stop, as illustrated in FIG. 4E. This is followed by a poly etch-back process, such as RIE, to remove the top portions of poly layer 102 leaving just poly blocks 103 adjacent oxide blocks 108, and exposing oxide layer 64. Poly blocks 103 have lower portions 70 disposed immediately adjacent to poly layer 14, and upper portions 72 that extend over a portion of the poly layer 14 including sharp edge 66. Poly blocks 103 are insulated from poly layer 14 by oxide layers 64 and 32. Oxide blocks 108 and oxide layer 36 are left to extend well above the top surface of poly blocks 103, as illustrated in FIG. 4F.

Figure 4G:
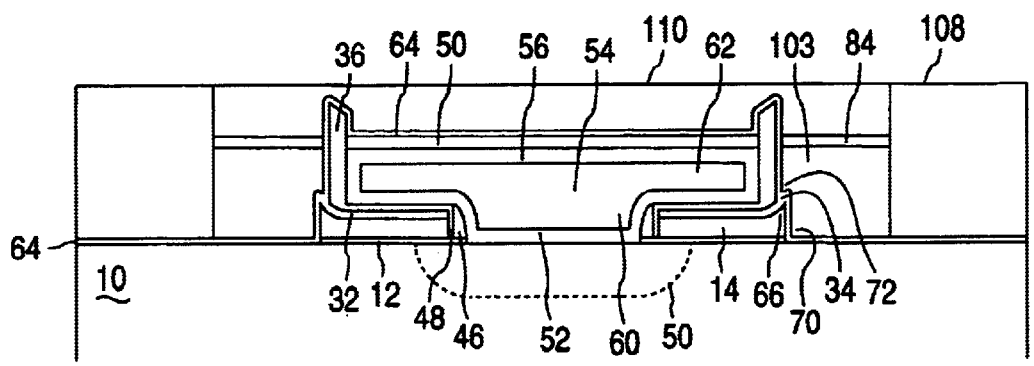

An optional implant step can be performed to dope the exposed poly blocks 103. A metal deposition step is then performed, to deposit a metal such as tungsten, cobalt, titanium, nickel, platinum, or molybdenum over the structure. The structure is then annealed, permitting the hot metal to flow and to seep into the exposed top portions of the poly blocks 103 to form a conductive layer of metalized silicon 84 thereon. The metal deposited on the remaining structure is removed by a metal etch process. Metalized silicon layer 84 can be called self aligned because it is self aligned to the poly blocks 103 by oxide layer 64 and oxide blocks 108. A protective nitride layer 110 is formed over poly blocks 103 and between oxide blocks 108 in the following manner. Nitride is deposited over the structure, followed by a planarizing nitride etch, such as CMP, with oxide blocks 108 used as the etching stop layer, so that nitride layer 110 is level with oxide blocks 108. The nitride layer 110 is self aligned to the poly blocks 103 by oxide blocks 108. The resulting structure is shown in FIG. 4G.

Figure 4H:
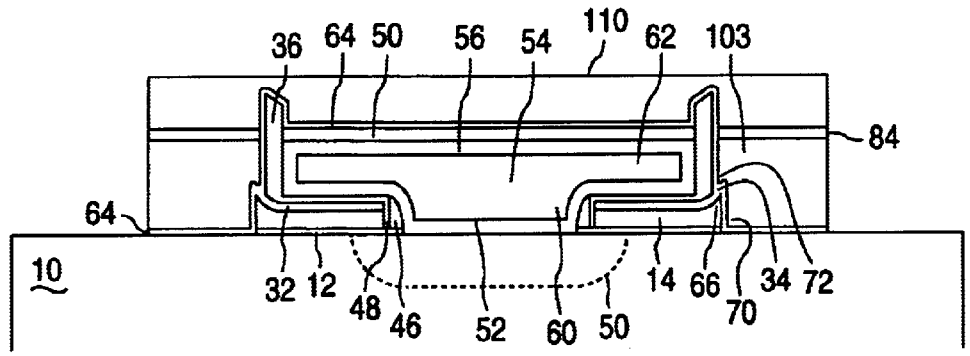
Figure 4I:
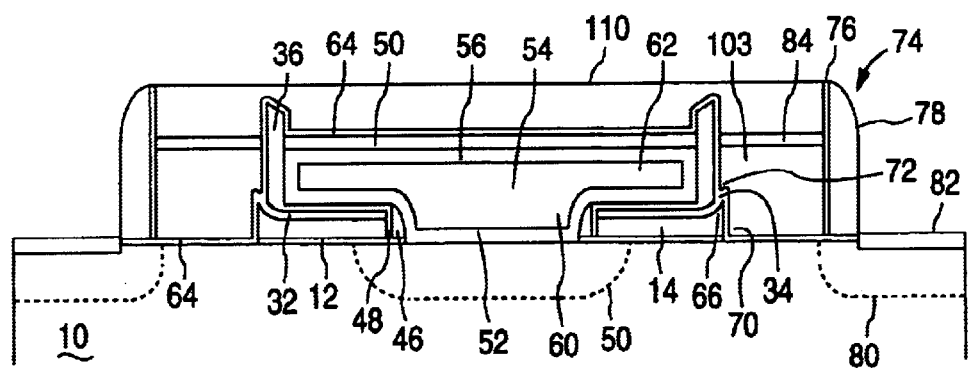

An oxide etch follows to remove oxide blocks 108 and exposed portions of oxide layer 64, as illustrated in FIG. 4H. Insulation spacers 74 are then formed adjacent to poly blocks 103 and nitride layer 110, and are made of one or more layers of material. In the preferred embodiment, insulation spacers 74 are made of two layers of material by first depositing a thin layer 76 of oxide, followed by the deposition of a nitride over the structure. An anisotropic nitride etch is performed to remove the deposited nitride, leaving nitride spacers 78. Ion implantation (e.g. N+) is then used to form second regions (terminals) 80 in the substrate in the same manner as the first regions 50 were formed. An oxide etch follows, which removes the exposed portions of oxide layer 76. A layer of metalized silicon (silicide) 82 is formed in the top of the substrate 10 next to side wall spacers 74, by depositing a metal such as tungsten, cobalt, titanium, nickel, platinum, or molybdenum over the structure. The structure is then annealed, permitting the hot metal to flow and to seep into the exposed top portions of the substrate 10 to form silicide regions 82. The metal deposited on the remaining structure is removed by a metal etch process. Metalized silicon region 82 on substrate 10 can be called self aligned silicide (i.e. salicide), because it is self aligned to the second regions 80 by spacers 78. The resulting structure is shown in FIG. 4I.

Figure 4J:
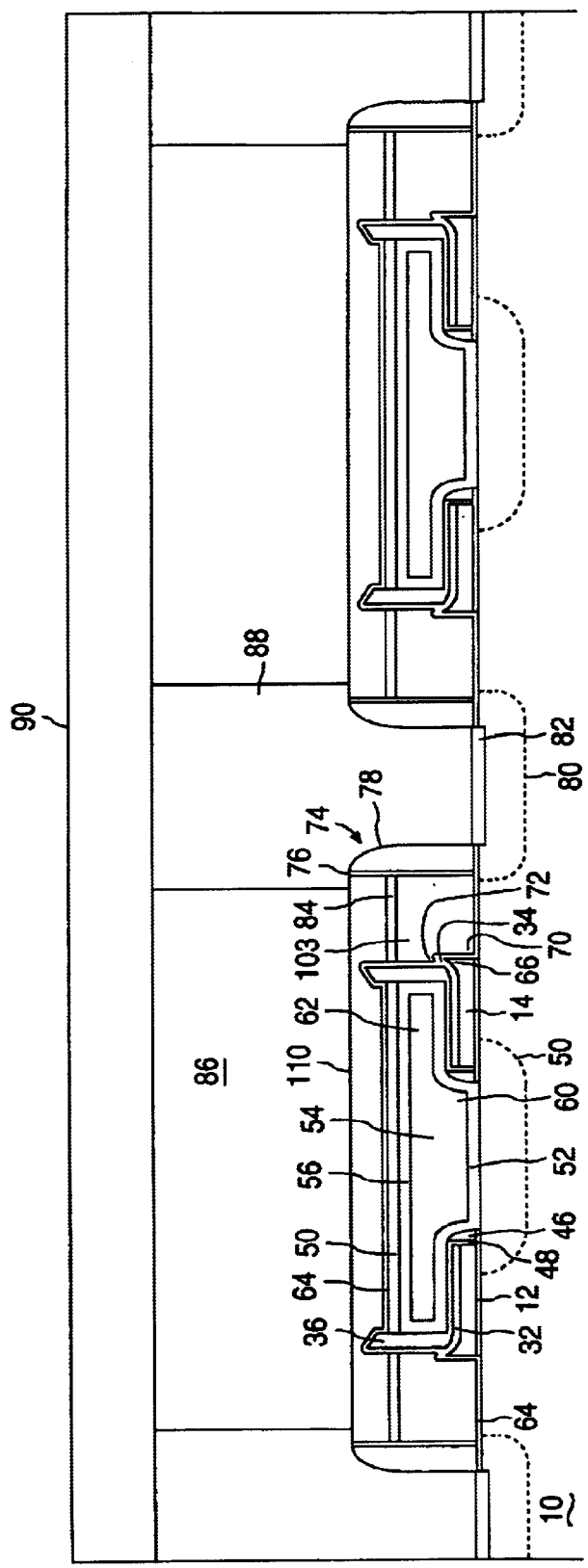

Passivation, such as BPSG 86, is used to cover the entire structure. A masking step is performed to define etching areas over the salicide regions 82. The BPSG 86 is selectively etched in the masked regions to create contact openings that are ideally centered over and wider than the salicide regions 82 formed between adjacent sets of paired memory cells. Nitride layer 110 serves to protect poly blocks 103 and metalized silicon 84 from this etch process. The contact openings are then filled with a conductor metal by metal deposition and planarizing etch-back, whereby the entire area between nitride spacers 78 of adjacent sets of paired memory cells is filled with the deposited metal to form contact conductors 88 that are self aligned to the salicide regions 82 by the nitride spacers 78 (i.e. self aligned contact scheme, or SAC). The salicide layers 82 facilitate conduction between the conductors 88 and second regions 80. A bit line 90 is added by metal masking over the BPSG 86, to connect together all the conductors 88 in the column of memory cells. The final memory cell structure is illustrated in FIG. 4J.

The self aligned contact scheme (SAC) removes an important constraint on the minimum spacing requirement between adjacent sets of paired memory cells. Specifically, while FIG. 4J illustrates the contact area (and thus conductors 88) perfectly centered over the salicide regions 82, in reality it is very difficult to form the contact openings without some undesirable horizontal shift relative to the salicide regions 82. With a non-self aligned contact scheme, where there is no protective layer of nitride over the structure before BPSG formation, electrical shorts can occur if the contact 88 is shifted over and formed over metalized silicon 84 and poly block 103. To prevent electrical shorts in a non-self aligned contact scheme, the contact openings would have to be formed sufficiently away from the nitride spacers 78 so that even with the maximum possible shift in the contact regions, they will not extend to nitride spacers 78 or beyond. This of course would present a constraint on the minimum distance between spacers 78, in order to provide a sufficient tolerance distance between adjacent sets of paired mirror cells.

The SAC method of the present invention eliminates this constraint by using the protective layer of material (nitride layer 110) underneath the BPSG. With this protective layer, the contact openings are formed in the BPSG with a sufficient width to ensure there is overlap of the contact opening with the salicide regions 82, even if there is a significant horizontal shift of the contact opening during formation. Nitride layer 110 allows portions of contact 88 to be formed over poly block 103 or metalized silicon layer 84, without any shorting therebetween. The wide contact opening guarantees that contacts 88 completely fill the very narrow spaces between spacers 78, and make good electrical contact with salicide regions 82. Thus, the width of contact regions between spacers 78 can be minimized, while preventing faulty connections by filling the space between spacers 78, allowing the scaling down of the overall cell dimension.

This second alternate embodiment has the further advantage that control gates 103 are substantially rectangularly shaped with a protruding portion 72 over the floating gate 14, and a planar opposing surface that facilitates the formation of spacers 74, which in turn facilitates the self aligned formation of the salicide regions 82, and the formation of the self aligned conductor 88.

Third Alternate Embodiment

FIGS. 5A–5K illustrate a third alternate process for forming a memory cell array similar to that illustrated in FIG. 3I, but utilizing a self aligned contact scheme. This third alternate process begins with the same structure as shown in FIG. 3C, but continues as follows.

Figure 5A:
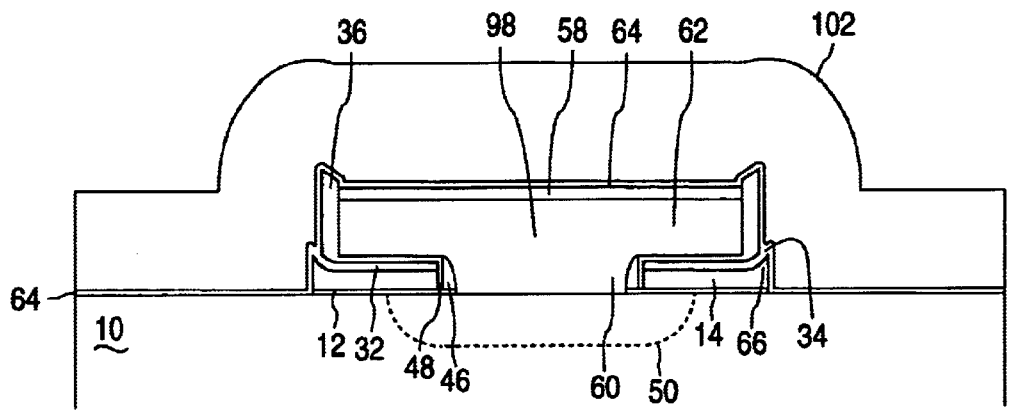
FIGS. 5A–5K are cross sectional views taken along the line 2—2 of FIG. 1C showing in sequence the steps in a third alternate processing of the structure shown in FIG. 1C, in the formation of a non volatile memory array of floating memory cells of the split gate type.
Figure 5B:
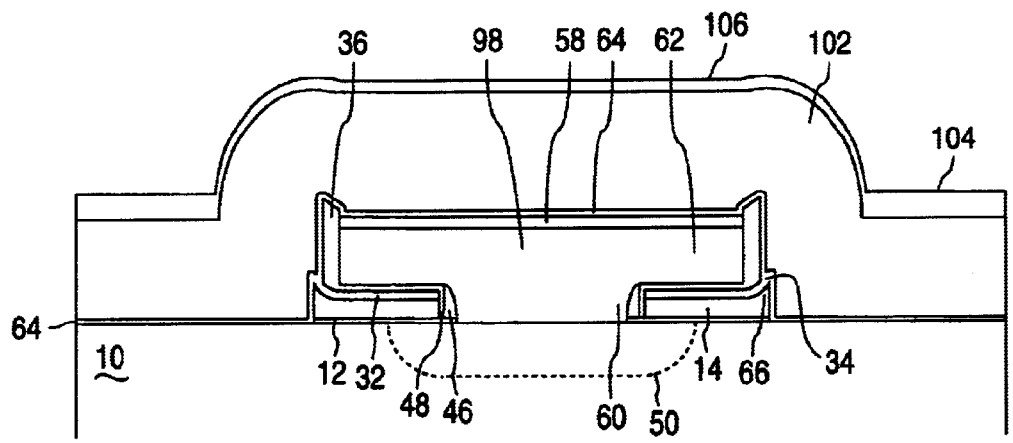

A thick layer 102 of conductive material, such as polysilicon, is deposited over the structure, as shown in FIG. 5A. A layer of nitride 104 is then deposited over the structure, followed by a nitride planarization process (e.g. CMP). A nitride etch-back step follows to remove the portions of nitride layer 104 over the raised portions of poly layer 102, while leaving portions of nitride layer 104 over the flat side portions of poly layer 102. An oxidation step follows, which oxidizes the exposed center portions of poly layer 102 to form a layer of oxide 106 thereover. The resulting structure is shown in FIG. 5B.

Figure 5C:
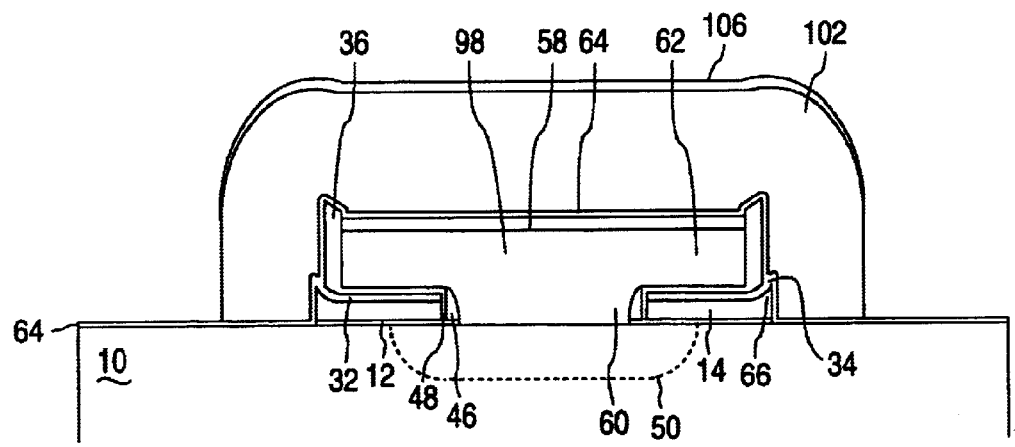

Nitride layer 104 is removed by a nitride etch process, which is followed by an anisotropic poly etch step to remove those portions of poly layer 102 not directly under oxide layer 106, as illustrated in FIG. 5C.

Figure 5D:
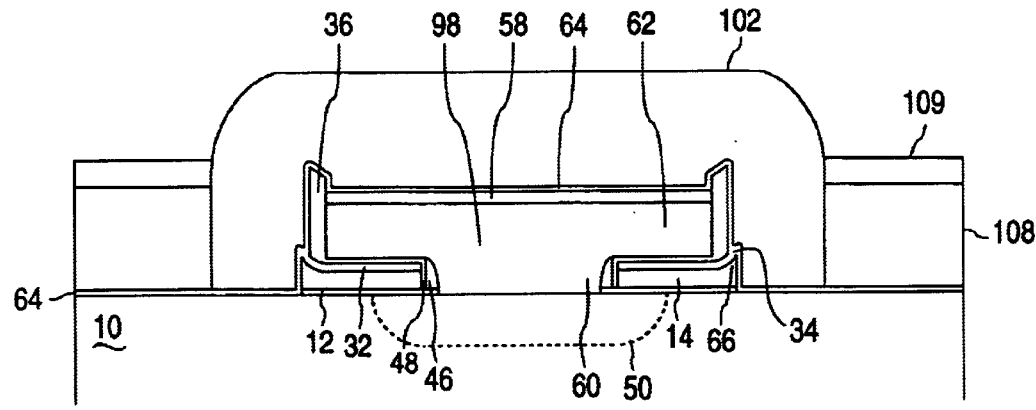

An oxide deposition step is then performed to apply a thick oxide layer 108 over the structure. This is followed by a planarizing oxide etch, such as CMP, to planarize the structure using poly layer 102 as an etch stop. An oxide etch-back step is then performed, leaving blocks 108 of oxide on either side of the poly layer 102. Oxide layer 106 is also removed by the oxide planarizing and etch-back steps. A nitride deposition step is then performed to apply a nitride layer over the structure. This is followed by a planarizing nitride etch, such as CMP, to planarize the structure using poly layer 102 as an etch stop. A nitride etch-back step is then performed, leaving nitride layer 109 over oxide blocks 108. The resulting structure is shown in FIG. 5D.

Figure 5E:
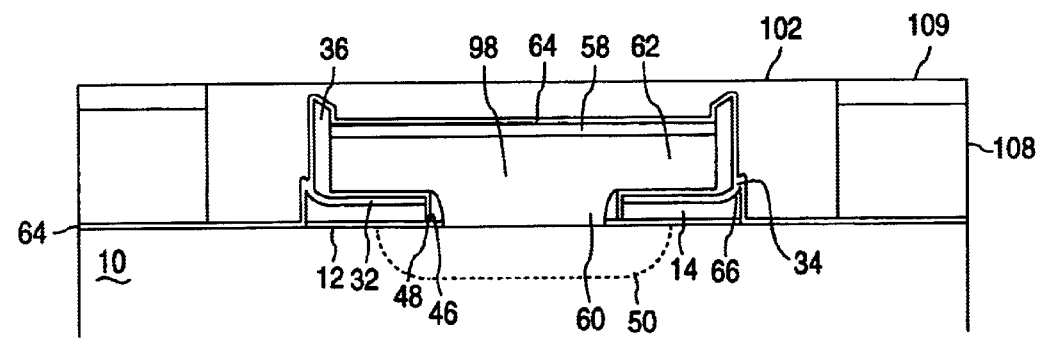
Figure 5F:
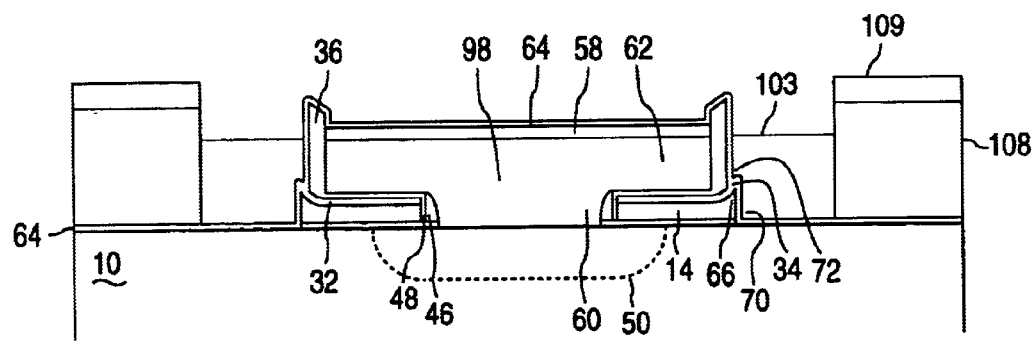

A planarizing poly etch, such as CMP, is then performed using the nitride layer 109 as an etch stop, as illustrated in FIG. 5E. This is followed by a poly etch-back process, such as RIE, to remove the top portions of poly layer 102 leaving just poly blocks 103 adjacent oxide blocks 108, and exposing oxide layer 64. Poly blocks 103 have lower portions 70 disposed immediately adjacent to poly layer 14, and upper portions 72 that extend over a portion of the poly layer 14 including sharp edge 66. Poly blocks 103 are insulated from poly layer 14 by oxide layers 64 and 32. Oxide blocks 108 and oxide layer 36 are left to extend well above the top surface of poly blocks 103, as illustrated in FIG. 5F.

Figure 5G:
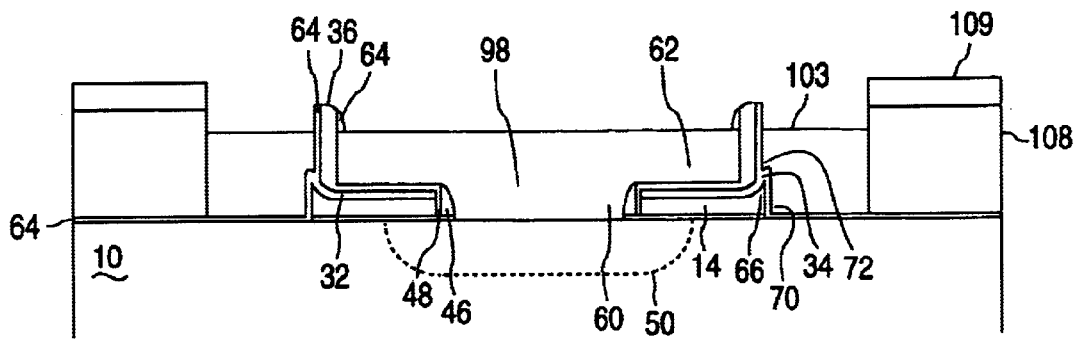

A controlled oxide etch is performed to remove exposed horizontal portions of oxide layer 64, and the underlying oxide layer 58, to expose poly blocks 98. Preferably, a dry-etch process with end-point detection is used, which also removes the upper portions of oxide layer 36, as illustrated in FIG. 5G.

Figure 5H:
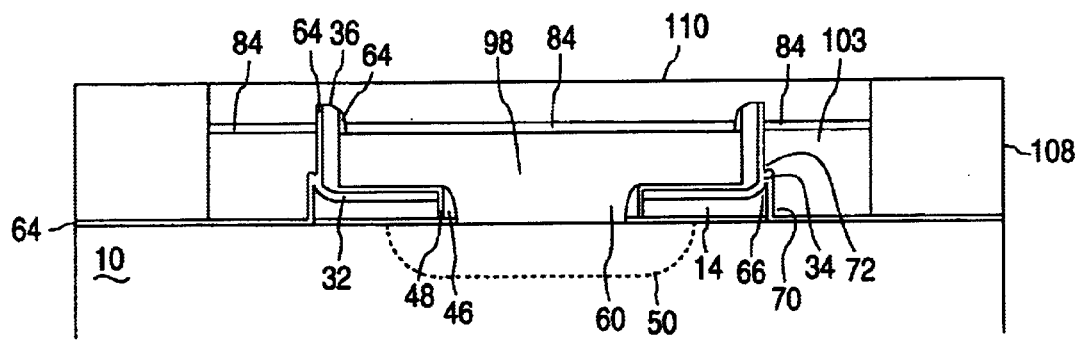

An optional implant step can be performed to dope the exposed poly blocks 103. A metal deposition step is then performed, to deposit a metal such as tungsten, cobalt, titanium, nickel, platinum, or molybdenum over the structure. The structure is then annealed, permitting the hot metal to flow and to seep into the exposed top portions of the poly blocks 103 and 98 to form a conductive layer of metalized silicon 84 thereon. The metal deposited on the remaining structure is removed by a metal etch process. Metalized silicon layer 84 can be called self aligned because it is self aligned to the poly blocks 103 by oxide layer 64 and oxide blocks 108. A protective nitride layer 110 is formed over poly blocks 103 and between oxide blocks 108 in the following manner. Nitride is deposited over the structure, followed by a planarizing nitride etch, such as CMP, with oxide blocks 108 used as the etching stop layer, so that nitride layer 110 is level with oxide blocks 108. Nitride layer 109 is also removed by this process. The nitride layer 110 is self aligned to the poly blocks 103 by oxide blocks 108. The resulting structure is shown in FIG. 5H.

Figure 5I:
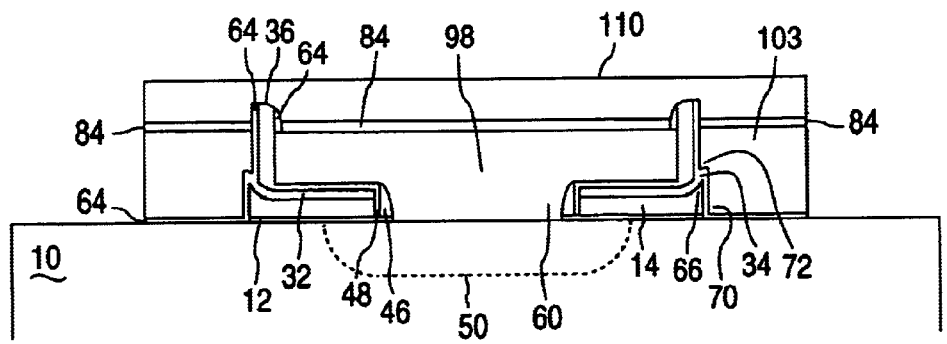
Figure 5J:
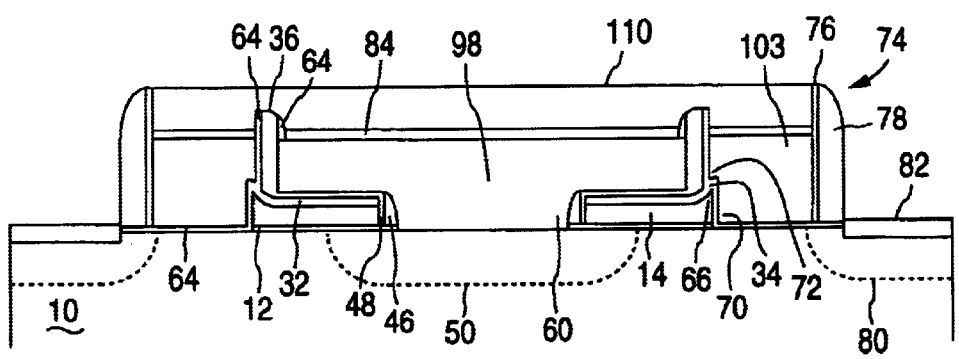

An oxide etch follows to remove oxide blocks 108 and exposed portions of oxide layer 64, as illustrated in FIG. 5I. Insulation spacers 74 are then formed adjacent to poly blocks 103 and nitride layer 110, and are made of one or more layers of material. In the preferred embodiment, insulation spacers 74 are made of two layers of material by first depositing a thin layer 76 of oxide, followed by the deposition of a nitride over the structure. An anisotropic nitride etch is performed using oxide layer 76 as an etch stop to remove the deposited nitride except for nitride spacers 78. Ion implantation (e.g. N+) is then used to form second regions (terminals) 80 in the substrate in the same manner as the first regions 50 were formed. An oxide etch follows, which removes the exposed portions of oxide layer 76. A layer of metalized silicon (silicide) 82 is formed in the top of the substrate 10 next to side wall spacers 74, by depositing a metal such as tungsten, cobalt, titanium, nickel, platinum, or molybdenum over the structure. The structure is then annealed, permitting the hot metal to flow and to seep into the exposed top portions of the substrate 10 to form silicide regions 82. The remaining metal deposited on the remaining structure is removed by a metal etch process. Metalized silicon region 82 on substrate 10 can be called self aligned silicide (i.e. salicide), because it is self aligned to the second regions 80 by spacers 78. The resulting structure is shown in FIG. 5J.

Figure 5K:
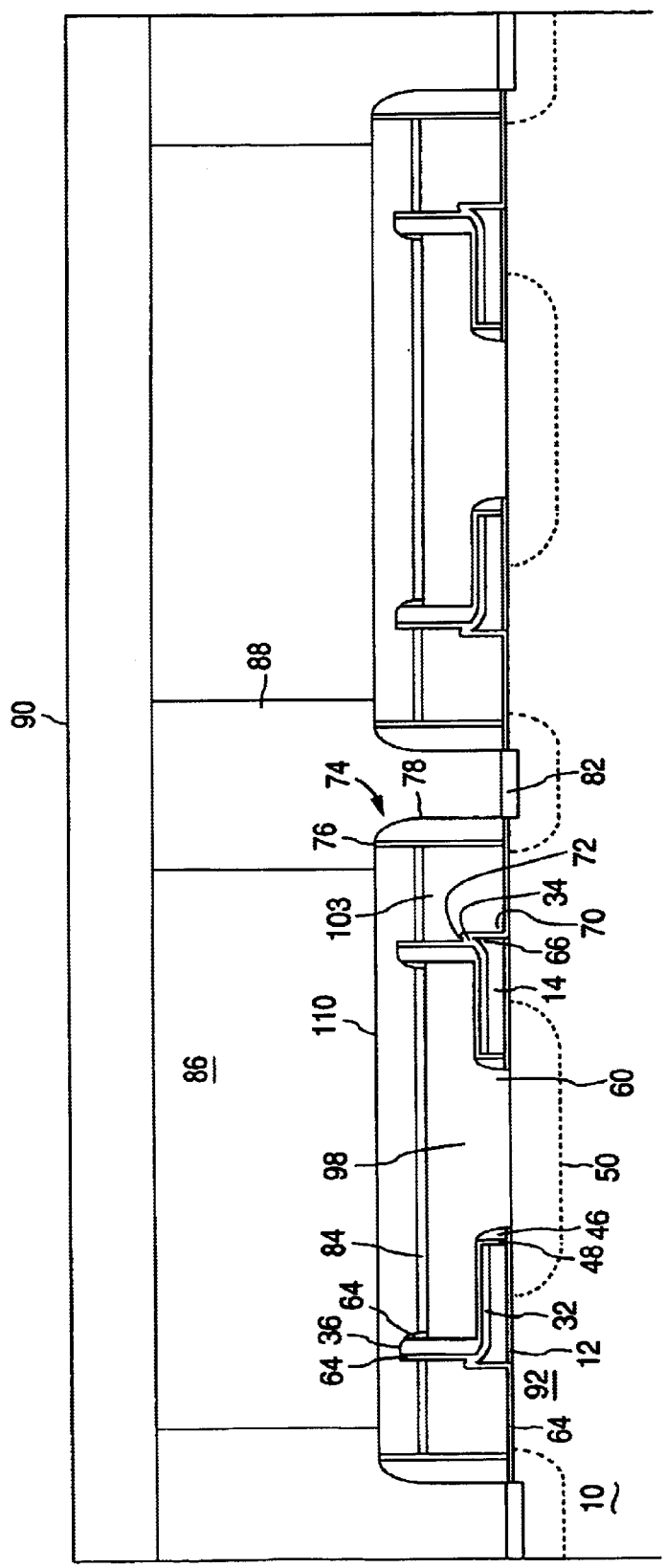

Passivation, such as BPSG 86, is used to cover the entire structure. A masking step is performed to define etching areas over the salicide regions 82. The BPSG 86 is selectively etched in the masked regions to create contact openings that are ideally centered over and wider than the salicide regions 82 formed between adjacent sets of paired memory cells. Nitride layer 110 serves to protect poly blocks 103 and metalized silicon layers 84 from this etch process. The contact openings are then filled with a conductor metal by metal deposition and planarizing etch-back, whereby the entire area between nitride spacers 78 of adjacent sets of paired memory cells is filled with the deposited metal to form contact conductors 88 that are self aligned to the salicide regions 82 by the nitride spacers 78 (i.e. self aligned contact scheme, or SAC). The salicide layers 82 facilitate conduction between the conductors 88 and second regions 80. A bit line 90 is added by metal masking over the BPSG 86, to connect together all the conductors 88 in the column of memory cells. The final memory cell structure is illustrated in FIG. 5K.

The third alternate embodiment has the advantage of combining the advantages of the first alternate embodiment, with the advantages of SAC.

It is to be understood that the present invention is not limited to the embodiments described above and illustrated herein, but encompasses any and all variations falling within the scope of the appended claims. For example, although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Finally, the first trench upper and lower portions need not be symmetrical, but rather the first trenches need only have an indentation in the sidewall thereof so that the source line formed therein has a first portion disposed adjacent to the floating gate, and a second portion disposed over the floating gate.

What is claimed is:

1. An electrically programmable and erasable memory device comprising:

a substrate of semiconductor material of a first conductivity type;

first and second spaced-apart regions of a second conductivity type formed in the substrate, with a channel region therebetween;

an electrically conductive floating gate disposed vertically over and insulated from a portion of said channel region and a portion of the first region;

an electrically conductive source region electrically connected to the first region in the substrate, the source region having a lower portion that is disposed vertically over the first region and laterally adjacent to and insulated from the floating gate, and an upper portion that extends up and over the floating gate and terminates in a first end that is disposed vertically over and insulated from the floating gate;

an electrically conductive control gate having a first portion and a second portion, the first control gate portion being disposed laterally adjacent to and insulated from the floating gate, and the second control gate portion extends up and over the floating gate and terminates in a second end that is disposed vertically over and insulated from the floating gate;

wherein the first and second ends are disposed laterally adjacent to and insulated from each other such that no portion of the control gate is disposed directly between the floating gate and the source region; and insulation material disposed directly between the first end and the floating gate, and having a thickness for permitting voltage coupling therebetween.

2. An array of electrically programmable and erasable memory devices comprising:

a substrate of semiconductor material of a first conductivity type;

spaced apart isolation regions formed on the substrate which are substantially parallel to one another and extend in a first direction, with an active region between each pair of adjacent isolation regions; and each of the active regions including a column of pairs of memory cells extending in the first direction, each of the memory cell pairs including:

a first region and a pair of second regions spaced apart in the substrate and having a second conductivity type, with channel regions formed in the substrate between the first region and the second regions, a pair of electrically conductive floating gates each disposed vertically over and insulated from a portion of one of the channel regions and a portion of the first region, an electrically conductive source region electrically connected to the first region in the substrate, the source region having a lower portion that is disposed vertically over the first region and laterally adjacent to and insulated from the pair of floating gates, and an upper portion that extends up and over the floating gates and terminates in a pair of first ends that each is disposed vertically over and insulated from one of the floating gates, a pair of electrically conductive control gates each having a first portion and a second portion, wherein for each of the control gates, the first control gate portion is disposed laterally adjacent to and insulated from one of the floating gates and the second control gate portion extends up and over the one floating gate and terminates in a second end that is disposed vertically over and insulated from the one floating gate, wherein each of the first ends is disposed laterally adjacent to and insulated from one of the second ends such that no portion of the control gates is disposed directly between the floating gates and the source region, and insulation material disposed directly between the first ends and the floating gates, and having a thickness for permitting voltage coupling therebetween.

3. An electrically programmable and erasable memory device comprising:

a substrate of semiconductor material of a first conductivity type;

first and second spaced-apart regions of a second conductivity type formed in the substrate, with a channel region therebetween;

an electrically conductive floating gate disposed vertically over and insulated from a portion of said channel region and a portion of the first region;

an electrically conductive source region electrically connected to the first region in the substrate, the source region having a lower portion that is disposed vertically over the first region and laterally adjacent to and insulated from the floating gate, and an upper portion that extends up and over the floating gate and terminates in a first end that is disposed vertically over and insulated from the floating gate;

an electrically conductive control gate having a first portion and a second portion, the first control gate portion being disposed laterally adjacent to and insulated from the floating gate, and the second control gate portion extends up and over the floating gate and terminates in a second end that is disposed vertically over and insulated from the floating gate;

wherein the first and second ends are disposed laterally adjacent to and insulated from each other such that there is no vertical overlap between the control gate and the source region;

insulation material disposed directly between the source region lower portion and the floating gate, and having a thickness permitting voltage coupling therethrough; and insulation material disposed directly between the first end and the floating gate, and having a thickness permitting voltage coupling therethrough.

4. The device of claim 3, further comprising:

insulation material disposed directly between the floating gate and the second end, and having a thickness permitting Fowler-Nordheim tunneling of charges therethrough.

5. An array of electrically programmable and erasable memory devices comprising:

a substrate of semiconductor material of a first conductivity type;

spaced apart isolation regions formed on the substrate which are substantially parallel to one another and extend in a first direction, with an active region between each pair of adjacent isolation regions; and each of the active regions including a column of pairs of memory cells extending in the first direction, each of the memory cell pairs including:

a first region and a pair of second regions spaced apart in the substrate and having a second conductivity type, with channel regions formed in the substrate between the first region and the second regions, a pair of electrically conductive floating gates each disposed vertically over and insulated from a portion of one of the channel regions and a portion of the first region, an electrically conductive source region electrically connected to the first region in the substrate, the source region having a lower portion that is disposed vertically over the first region and laterally adjacent to and insulated from the pair of floating gates, and an upper portion that extends up and over the floating gates and terminates in a pair of first ends that each is disposed vertically over and insulated from one of the floating gates, a pair of electrically conductive control gates each having a first portion and a second portion, wherein for each of the control gates, the first control gate portion is disposed laterally adjacent to and insulated from one of the floating gates and the second control gate portion extends up and over the one floating gate and terminates in a second end that is disposed vertically over and insulated from the one floating gate, and wherein each of the first ends is disposed laterally adjacent to and insulated from one of the second ends such that there is no vertical overlap between the control gates and the source region, insulation material disposed directly between the source region lower portion and the pair of floating gates, and having a thickness permitting voltage coupling therethrough, and insulation material disposed directly between the the first ends and the floating gates, and having a thickness permitting voltage coupling therethrough.

6. The device of claim 5, wherein each of the source regions extends across the active regions and isolation regions in a second direction substantially perpendicular to the first direction and intercepts one of the memory cell pairs in each of the active regions.

7. The device of claim 5, wherein each of the memory cell pairs further comprises:

insulation material disposed directly between the floating gates and the second ends, and having a thickness permitting Fowler-Nordheim tunneling of charges therethrough.

* * * * *